US010745808B2

(12) United States Patent
Lei et al.

(10) Patent No.: US 10,745,808 B2
(45) Date of Patent: Aug. 18, 2020

(54) METHODS FOR DEPOSITING GROUP 13 METAL OR METALLOID NITRIDE FILMS

(71) Applicant: Air Products and Chemicals, Inc., Allentown, PA (US)

(72) Inventors: Xinjian Lei, Vista, CA (US);
Moo-Sung Kim, Gyunggi-Do (KR);
Sergei Vladimirovich Ivanov, Schnecksville, PA (US)

(73) Assignee: Versum Materials US, LLC, Tempe, AZ (US)

( * ) Notice: Subject to any disclaimer, the term of this patent is extended or adjusted under 35 U.S.C. 154(b) by 0 days.

(21) Appl. No.: 15/210,172

(22) Filed: Jul. 14, 2016

(65) Prior Publication Data
US 2017/0022612 A1  Jan. 26, 2017

Related U.S. Application Data

(60) Provisional application No. 62/196,494, filed on Jul. 24, 2015.

(51) Int. Cl.
*C23C 16/34* (2006.01)
*C23C 16/50* (2006.01)
(Continued)

(52) U.S. Cl.
CPC ............ *C23C 16/50* (2013.01); *C23C 16/303* (2013.01); *C23C 16/342* (2013.01);
(Continued)

(58) Field of Classification Search
CPC ................ C23C 16/303; C23C 16/455; C23C 16/45525; C23C 16/45542;
(Continued)

(56) References Cited

U.S. PATENT DOCUMENTS 7,141,500 B2   11/2006  Jursich et al.
8,218,099 B2 *  7/2012  Yamazaki ........... H01L 27/1225
                                               349/43
(Continued)

FOREIGN PATENT DOCUMENTS

CN       1031137476 A    6/2013
EP         2857552 A2    8/2015
(Continued)

OTHER PUBLICATIONS

Alevli, M. et al., "The Influence of N2/H2 and Ammonia N Source Materials on Optical and Structural Properties of AlN Films Grown by Plasma Enhanced Atomic Layer Deposition", J. Crystal Growth, vol. 335(1); pp. 51-57 (2011), Sep. 10, 2011.
(Continued)

*Primary Examiner* — Marianne L Padgett
(74) *Attorney, Agent, or Firm* — Lina Yang

(57) ABSTRACT

Described herein are methods for forming a Group 13 metal or metalloid nitride film. In one aspect, there is provided a method of forming an aluminum nitride film comprising the steps of: providing a substrate in a reactor; introducing into the reactor an at least one aluminum precursor which reacts on at least a portion of the surface of the substrate to provide a chemisorbed layer; purging the reactor with a purge gas; introducing a plasma comprising non-hydrogen containing nitrogen plasma into the reactor to react with at least a portion of the chemisorbed layer and provide at least one reactive site wherein the plasma is generated at a power density ranging from about 0.01 to about 1.5 W/cm$^2$; and optionally purge the reactor with an inert gas; and wherein the steps are repeated until a desired thickness of the aluminum nitride film is obtained.

19 Claims, 8 Drawing Sheets

(51) Int. Cl.
| | |
|---|---|
| *C23C 16/56* | (2006.01) |
| *C23C 16/455* | (2006.01) |
| *C23C 16/30* | (2006.01) |
| *C23C 16/505* | (2006.01) |
| *C23C 16/48* | (2006.01) |

(52) U.S. Cl.
CPC ...... *C23C 16/455* (2013.01); *C23C 16/45525* (2013.01); *C23C 16/45531* (2013.01); *C23C 16/45542* (2013.01); *C23C 16/45553* (2013.01); *C23C 16/48* (2013.01); *C23C 16/505* (2013.01); *C23C 16/56* (2013.01)

(58) Field of Classification Search
CPC .............. C23C 16/45553; C23C 16/50; C23C 16/505–5096; C23C 16/56
USPC ................ 427/534, 535, 564, 569, 570, 576
See application file for complete search history.

(56) References Cited

U.S. PATENT DOCUMENTS

| | | | | |
|---|---|---|---|---|
| 8,318,590 | B2* | 11/2012 | Kraus | C23C 16/303 |
| | | | | 118/715 |
| 8,546,161 | B2* | 10/2013 | Yamazaki | H01L 27/1225 |
| | | | | 438/30 |
| 9,905,415 | B2* | 2/2018 | Chandra | C23C 14/027 |
| 10,319,862 | B2* | 6/2019 | Ridgeway | C23C 16/345 |
| 2003/0228710 | A1* | 12/2003 | Drewes | B82Y 25/00 |
| | | | | 438/3 |
| 2005/0136679 | A1* | 6/2005 | Colombo | H01L 21/02164 |
| | | | | 438/706 |
| 2005/0208718 | A1 | 9/2005 | Lim et al. | |
| 2010/0003406 | A1 | 1/2010 | Lam | |
| 2010/0102417 | A1 | 4/2010 | Ganguli | |
| 2011/0244694 | A1 | 10/2011 | Antonelli et al. | |
| 2013/0008345 | A1* | 1/2013 | Lei | C07F 5/00 |
| | | | | 106/286.2 |
| 2013/0078392 | A1* | 3/2013 | Xiao | C07F 7/025 |
| | | | | 427/579 |
| 2013/0181240 | A1* | 7/2013 | Chen | H01L 33/005 |
| | | | | 257/94 |
| 2013/0330473 | A1 | 12/2013 | Winter | |
| 2014/0061659 | A1* | 3/2014 | Teplik | H01L 29/402 |
| | | | | 257/76 |
| 2015/0021599 | A1* | 1/2015 | Ridgeway | C23C 16/345 |
| | | | | 257/43 |
| 2015/0099375 | A1* | 4/2015 | Haripin | C23C 14/027 |
| | | | | 438/793 |
| 2015/0140789 | A1 | 5/2015 | Nepal | |
| 2015/0294857 | A1* | 10/2015 | Chen | H01L 21/0254 |
| | | | | 257/76 |
| 2018/0151346 | A1* | 5/2018 | Blanquart | H01L 21/02126 |
| 2018/0245215 | A1* | 8/2018 | Lei | C23C 16/303 |
| 2018/0274097 | A1* | 9/2018 | Lei | C23C 16/303 |
| 2018/0355483 | A1* | 12/2018 | Kuchenbeiser | C07F 7/025 |

FOREIGN PATENT DOCUMENTS

| | | | | |
|---|---|---|---|---|
| WO | 2004108985 A2 | 12/2004 | | |
| WO | WO-2013134661 A1 * | 9/2013 | ............. | C23C 16/34 |

OTHER PUBLICATIONS

Alevli, M. et al., "Optical Properties of AlN Thin Films Grown by Plasma Enhanced Atomic Layer Deposition", J. Vac. Sci. Technology., A, vol. 30(2), Feb. 17, 2012.

Banerjee, S. et al., "Plead AlN: Controlling Growth and Film Crystallinity", Physica Status Solidi (C) 1-7 Current Topics in Solid State Physics, (2015), Jun. 10, 2015.

Goerke, S. et al., "Atomic Layer Deposition of AlN for Thin Membranes Using Trimethylaluminum and H2/N2 Plasma", Applied Surface Science, vol. 338(0), pp. 35-41, (2015), Feb. 25, 2015.

Liu, G. et al., "Atomic Layer Deposition of AlN With Tris(Dimethylamido)Aluminum and NH3, ECS Transactions", vol. 41(2), pp. 219-225, (2011).

Motamedi, P. et al., "Structural and Optical Characterization of Low-Temperature ALD Crystalline AlN", J. Cryst. Growth, vol. 421, pp. 45-52, (2015), Apr. 17, 2015; some parts illegible.

Ozgit, C. et al., "Self-limiting Low-temperature Growth of Crystalline AlN Thin Films by Plasma-Ehanced Atomic Layer Deposition", vol. 520(7); pp. 2750-2755, (2012), online for Dec. 2011.

Perros, A. P. et al., "Influence of Plasma Chemistry on Impurity Incorporation in AlN Prepared by Plasma Enhanced Atomic Layer Deposition", J. Physics D: Applied Physics, vol. 46, 8 pgs, (2013), Nov. 27, 2013.

Alevli, M. et al., "Structural Properties of AlN Films Deposited by Plasma-enhanced Atomic Layer Deposition at Different Growth Temperatures", Phys. Status Solidi A, vol. 209(2), pp. 266-271, (2012), online Nov. 29, 2011.

Dumont, H. et al., "Deposition and Characterization of BN/Si(0 0 1) Using Tris(dimethylamino)borane", Materials Research Bulletin, vol. 37(9), pp. 1565-1572 (2002), after Jun. 4, 2002.

Eddy, Charles R., et al., "Perspectives on future directions in III-N semiconductor research", Journal of Vacuum Science and Technology: Part A., vol. 31, No. 5, Jul. 16, 2013, p. 058501.

* cited by examiner

METHODS FOR DEPOSITING GROUP 13 METAL OR METALLOID NITRIDE FILMS

CROSS REFERENCE TO RELATED APPLICATIONS

This application claim priority under 35 U.S.C. § 119(e) to U.S. provisional patent application No. 61/196,494, filed on Jul. 24, 2015, the entirety of which is incorporated herein by reference.

BACKGROUND OF THE INVENTION

Described herein is a method for depositing a stoichiometric or non-stoichiometric metal or a metalloid nitride film of a metal from Group 13 of the Periodic Table using one or more Group 13 metal or metalloid precursors. More specifically, described herein are plasma-based methods for depositing films including, but not limited to, plasma enhanced atomic layer deposition ("PEALD"), and PEALD-like plasma enhanced cyclic chemical vapor deposition ("PECCVD") methods that are typically used for depositing Group 13 metal or metalloid films such as aluminum, gallium, indium, thallium, boron, or combinations thereof that can be used, for example, in the fabrication of integrated circuit devices. Because of its combination of unique properties, Group 13 containing metals of metalloid films such as, without limitation, aluminum nitride (AlN) or boron nitride (BN) films can be used for a variety of electronic applications.

The prior art provides different methods for preparing and using Group 13 metal or metalloid films such as AlN films. For example, the reference "The influence of $N_2/H_2$ and ammonia N source materials on optical and structural properties of AlN films grown by plasma enhanced atomic layer deposition," Alevli, M., et al., J. Cryst. Growth, Vol. 335(1): 51-57 (2011), discloses the influence of $N_2/H_2$ and ammonia as N source materials on the properties of AlN films grown by plasma enhanced at. layer deposition using trimethylaluminum as the metal. The AlN growth rate per cycle was decreased from 0.84 to 0.54 Å/cycle when the N source was changed from $NH_3$ to $N_2/H_2$. Growth rate of AlN remained constant within 100-200° C. for both N precursors, confirming the self-limiting growth mode in the ALD window.

The reference "Optical properties of AlN thin films grown by plasma enhanced atomic layer deposition," Alevli, M., et al., J. Vac. Sci. Technol., A, Vol 30(2): 021506/021501-021506/021506 discloses crystalline aluminum nitride (AlN) films that were prepared by plasma enhanced atomic layer deposition within the temperature range of 100 and 500° C. The reference shows a relationship between growth temperature and optical properties and the refractive indexes of the AlN films were larger than 1.9 within the 300-1000 nm wavelength range.

The reference, "PEALD AlN: Controlling growth and film crystallinity," Banerjee, S. et al., Physica Status Solidi (C) Current Topics in Solid State Physics, discloses the growth kinetics and material properties of aluminium nitride (AlN) films deposited on Si(111), with plasma enhanced atomic layer deposition (PEALD). Tri-methyl aluminum (TMA) and $NH_3$-plasma were used as the precursors.

The reference, "Atomic layer deposition of AlN for thin membranes using trimethylaluminum and $H_2/N_2$ plasma," Goerke, S., et al., Applied Surface Science Vol. 338(0): 35-41 (2015), describes a method for depositing aluminum nitride (AlN) thin films with thicknesses from 20 to 100 nm were deposited on silicon, amorphous silica, silicon nitride, and vitreous carbon by plasma enhanced atomic layer deposition (PE-ALD) using trimethylaluminum (TMA) and a $H_2/N_2$ plasma mixture.

The reference, "Atomic Layer Deposition of AlN with Tris(Dimethylamido)aluminum and $NH_3$," Liu, G., et al., ECS Transactions 41(2): 219-225 (2011) discloses atomic layer deposition of aluminum nitride on Si wafers using tris(dimethylamido)aluminum and ammonia has been investigated in the temperature range from 180 to 400° C.

The reference, "Structural and optical characterization of low-temperature ALD crystalline AlN," Motamedi, P. et al., J. Cryst. Growth 421: 45-52 (2015) describes a plasma enhanced atomic layer deposition (PEALD) process has been used to deposit crystalline AlN thin films at 250° C. using nitrogen 5% hydrogen plasma and trimethylaluminum precursors. Films grown on single crystal silicon and sapphire substrates are crystalline with strong (100) preferred orientation.

The reference, "Self-limiting low-temperature growth of crystalline AlN thin films by plasma-enhanced atomic layer deposition," Ozgit, C., et al., Thin Solid Films 520(7): 2750-2755 (2012) described PEALD depositions of aluminum-containing films on various substrates using $AlMe_3$ and $NH_3$.

The reference, "Influence of plasma chemistry on impurity incorporation in AlN prepared by plasma enhanced atomic layer deposition," Perros, A. P., et al., Journal of Physics D: Applied Physics 46(50): 505502 described PEALD depositions of AlN films using $NH_3$, $N_2/H_2$, and $N_2$ plasmas and TMA as the precursor. Different atomistic growth mechanisms are found to exist between the plasma chemistries. The $N_2$ plasma is shown as not suitable for the low-temperature deposition of AlN. Films deposited by $NH_3$- and $N_2/H_2$-based processes are nitrogen rich and heavily hydrogenated. Carbon impurities exist at higher concentrations for the $N_2/H_2$-processes. The discovery of nitrile groups in the films indicates that carbon impurities can be partially attributed to an undesirable reaction occurring during the plasma step between nitrogen species and CH groups.

The reference, "Structural properties of AlN films deposited by plasma-enhanced atomic layer deposition at different growth temperatures," Alevli, M., et al., Phys. Status Solidi A 209(2): 266-271 (2012) describes the preparation of crystalline aluminum nitride (AlN) films by PEALD within the temp. range from 100° to 500° C.

The reference, "Deposition and characterization of BN/Si (001) using tris(dimethylamino)borane," Dumont, H. et al., Mater. Res. Bull. Vol. 37(9), pp. 1565-1572 (2002), describes using a chemical vapor deposition process to deposit BN thins films on Si(001) at temperatures ranging from 750° C. and 1000° C. using (tris(dimethylamino) borane as the precursor.

U.S. Pat. No. 7,141,500 discloses a method of forming an aluminum containing film such as aluminum oxide, aluminum nitride, or aluminum oxynitride on a substrate comprising: providing a precursor having the structure $Al(NR^1R^2)(NR^3R^4)(NR^5R^6)$ where each of $R^1$, $R^2$, $R^3$, $R^4$, $R^5$, and $R_6$ is independently selected from the group consisting of hydrogen and an alkyl group including at least 2 carbon atoms. Each of the $R^1$-$R^6$ groups can be the same or different and can by straight or branched chain alkyls. An exemplary precursor that is useful in forming Al containing films is trisdiethylamino aluminum.

US Pub. No. 2005/0208718 discloses a method for forming a capacitor using an atomic layer deposition (ALD) process include providing a reactant including an Al precursor onto a substrate to chemisorb a portion of the reactant to a surface of the substrate. An NH₃ plasma is provided onto the substrate to form a dielectric layer including Al nitride on the substrate including the lower electrode.

Accordingly, there is a need in the art to provide a low temperature (e.g., processing temperature of 400° C. or below) method for depositing a conformal, high quality, aluminum nitride film wherein the film has one or more of the following characteristics: a density of 2.4 grams per cubic centimeter (g/cc) or greater, a low wet etch rate (as measured in dilute hydrofluoric acid (HF)), hydrogen content less than 20 at. %, reflective index greater than 2.00 and combinations thereof compared to other aluminum nitride films using other deposition methods.

BRIEF SUMMARY OF THE INVENTION

Described herein are methods for forming stoichiometric or non-stoichiometric Group 13 metal or metalloid containing films such as aluminum, gallium, indium, thallium, boron, or combinations thereof nitride films onto at least a portion of a substrate.

In one aspect, there is provided a method of forming group 13 nitride films such as aluminum nitride, boron nitride, gallium nitride, indium nitride, thallium nitride or combinations thereof, the method comprising the steps of:
  a. providing a substrate in a reactor;
  b. introducing into the reactor an at least one Group 13 metal or metalloid precursor represented by the following Formula I:

$$MR_n(NR^1R^2)_{3-n} \qquad \text{I}$$

wherein M is selected from the group consisting of boron (B), aluminum (Al), gallium (Ga), indium (In), thallium (Th), and combinations; R is selected from a linear or branched $C_1$ to $C_{10}$ alkyl group, a linear or branched $C_2$ to $C_{10}$ alkenyl group, a linear or branched $C_2$ to $C_{10}$ alkynyl group, a $C_1$ to $C_6$ dialkylamino group, an electron withdrawing group, and a $C_6$ to $C_{10}$ aryl group; $R^1$ is selected from hydrogen, a linear or branched $C_1$ to $C_{10}$ alkyl group, a linear or branched $C_3$ to $C_{10}$ alkenyl group, a linear or branched $C_3$ to $C_{10}$ alkynyl group, a $C_1$ to $C_6$ dialkylamino group, an electron withdrawing group, and a $C_6$ to $C_{10}$ aryl group; $R^2$ is selected from a linear or branched $C_1$ to $C_{10}$ alkyl group, a linear or branched $C_3$ to $C_6$ alkenyl group, a linear or branched $C_3$ to $C_6$ alkynyl group, a $C_1$ to $C_6$ dialkylamino group, a $C_6$ to $C_{10}$ aryl group, a linear or branched $C_1$ to $C_6$ fluorinated alkyl group, an electron withdrawing group, and a $C_4$ to $C_{10}$ aryl group; optionally wherein $R^1$ and $R^2$ are linked together to form a ring selected from a substituted or unsubstituted aromatic ring or a substituted or unsubstituted aliphatic ring; and n=0, 1, 2 or 3, wherein the at least one group 13 metal or metalloid precursor reacts on at least a portion of the surface of the substrate to provide a chemisorbed layer;
  c. purging the reactor with a purge gas;
  d. introducing a plasma comprising nitrogen into the reactor to react with at least a portion of the chemisorbed layer and provide at least one reactive site wherein the plasma is generated at a power density ranging from about 0.01 to about 1.5 W/cm²; and
  e. optionally purging the reactor with an inert gas; and wherein the steps b through e are repeated until a desired thickness of the film is obtained. In certain embodiments, $R^1$ and $R^2$ are the same. In other embodiments, $R^1$ and $R^2$ are different. In the foregoing or other embodiments, $R^1$ and $R^2$ can be linked together to form a ring. In the yet further embodiments, $R^1$ and $R^2$ are not linked together to form a ring. In a still further embodiment, the plasma comprises a non-hydrogen containing nitrogen plasma selected from the group consisting of nitrogen plasma, nitrogen/helium plasma, nitrogen/argon plasma, nitrogen/neon plasma.

In another aspect, there is provided a method of forming an aluminum nitride film via plasma enhanced atomic layer deposition process or PEALD-like process, the method comprising the steps of:
  a. providing a substrate in a reactor;
  b. introducing into the reactor at least one aluminum precursor is selected from the group consisting of trimethylaluminum, triethylaluminum, tris(dimethylamino)aluminum, and tris(ethylmethylamino)aluminum wherein the at least one aluminum precursor reacts on at least a portion of the surface of the substrate to provide a chemisorbed layer;
  c. purging the reactor with a purge gas comprising at least one selected from nitrogen, a noble gas, and combinations thereof;
  d. introducing a plasma comprising non-hydrogen containing nitrogen plasma into the reactor to react with at least a portion of the chemisorbed layer and provide at least one reactive site wherein the plasma is generated at a power density ranging from about 0.01 to about 1.5 W/cm²; and
  e. optionally purging the reactor with an inert gas; and wherein the steps b through e are repeated until a desired thickness of the aluminum nitride film is obtained

DETAILED DESCRIPTION OF THE INVENTION

Figure 1:
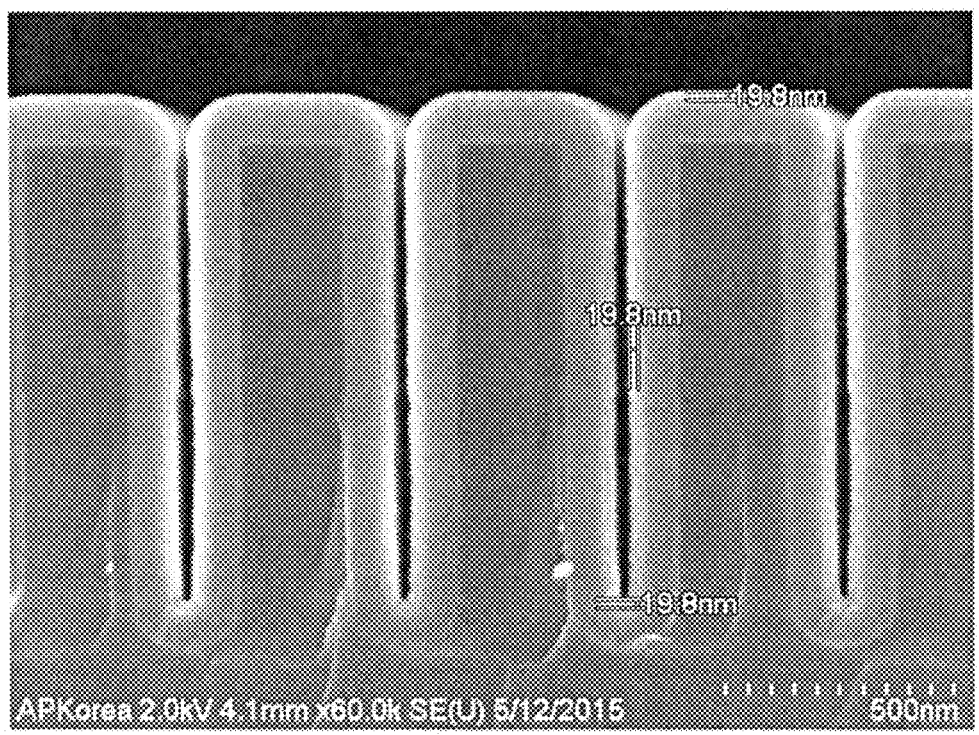
FIG. 1 provides a scanning electron microscope (SEM) image of AlN film deposited using tris(dimethylamino)aluminum and nitrogen plasma, demonstrating almost 100% conformality.
Figure 2:
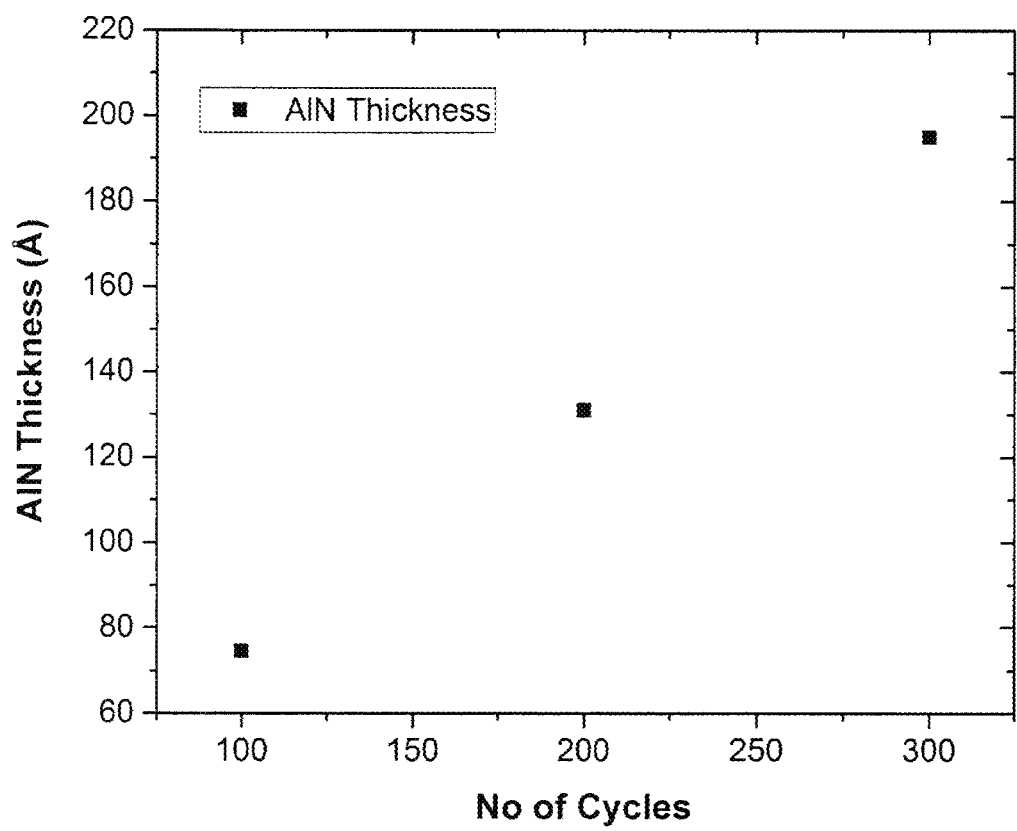
FIG. 2 provides thickness of AlN film deposited using tris(dimethylamino)aluminum and nitrogen plasma vs number of cycles, demonstrating good linearity between film thickness and number of cycles.

The deposition of conformal Group 13 metal or metalloid nitride films such as, without limitation, aluminum or boron nitride films, at low temperature, e.g., temperatures of 400° C. or less, which meet one or more criteria to be considered a high quality film, has been a long-standing industry challenge. A aluminum nitride film is considered a "high quality" film if it has one or more of the following characteristics: a density of 2.4 grams per cubic centimeter (g/cc) or greater as measured by X-ray-reflectometry (XRR), a low wet etch rate (as measured in dilute hydrofluoric acid (HF)), a hydrogen content of 20 atomic (at.)% or less as measured by Secondary Ion Mass Spectrometry (SIMS), a reflective index greater than 2.00 and combinations thereof.

Described herein are methods for forming stoichiometric or non-stoichiometric Group 13 nitride films such as aluminum nitride, boron nitride, gallium nitride, indium nitride, thallium nitride and combinations thereof onto at least a portion of a substrate. The group 13 nitride films such as aluminum nitride, boron nitride, gallium nitride, and indium nitride films described herein are deposited using at least one Group 13 precursor represented by the following Formula I:

$$MR_n(NR^1R^2)_{3-n} \qquad I$$

wherein M is selected from the group consisting of boron (B), aluminum (Al), gallium (Ga), indium (In), and thallium (Th); R is selected from a linear or branched $C_1$ to $C_{10}$ alkyl group, a linear or branched $C_2$ to $C_{10}$ alkenyl group, a linear or branched $C_2$ to $C_{10}$ alkynyl group, a $C_1$ to $C_6$ dialkylamino group, an electron withdrawing group, and a $C_6$ to $C_{10}$ aryl group; $R^1$ is selected from hydrogen, a linear or branched $C_1$ to $C_{10}$ alkyl group, a linear or branched $C_3$ to $C_{10}$ alkenyl group, a linear or branched $C_3$ to $C_{10}$ alkynyl group, a $C_1$ to $C_6$ dialkylamino group, an electron withdrawing group, and a $C_6$ to $C_{10}$ aryl group; $R^2$ is selected from a linear or branched $C_1$ to $C_{10}$ alkyl group, a linear or branched $C_3$ to $C_6$ alkenyl group, a linear or branched $C_4$ to $C_6$ alkynyl group, a $C_1$ to $C_6$ dialkylamino group, a $C_6$ to $C_{10}$ aryl group, a linear or branched $C_1$ to $C_6$ fluorinated alkyl group, an electron withdrawing group, and a $C_4$ to $C_{10}$ aryl group; optionally wherein $R^1$ and $R^2$ are linked together to form a ring selected from a substituted or unsubstituted aromatic ring or a substituted or unsubstituted aliphatic ring; and n=0, 1, 2 or 3. In certain embodiments of Formula I, R, $R^1$, and $R^3$ are methyl.

In the formulae and throughout the description, the term "alkyl" denotes a linear, or branched functional group having from 1 to 10 or 1 to 6 carbon atoms. Exemplary alkyl groups include, but are not limited to, methyl (Me), ethyl (Et), propyl (Pr$^n$), isopropyl (Pr$^i$), butyl (Bu$^n$), isobutyl (Bu$^i$), sec-butyl (Bu$^s$), tert-butyl (Bu$^t$), pentyl, iso-pentyl, tert-pentyl (Am$^t$), hexyl, iso-hexyl, and neo-hexyl.

In the formula and throughout the description, the term "cyclic alkyl" denotes a cyclic functional group having from 3 to 10 or from 4 to 10 carbon atoms or from 5 to 10 carbon atoms. Exemplary cyclic alkyl groups include, but are not limited to, cyclobutyl, cyclopentyl, cyclohexyl, and cyclooctyl groups.

In the formula and throughout the description, the term "aryl" denotes an aromatic cyclic functional group having from 5 to 12 carbon atoms or from 6 to 10 carbon atoms. Exemplary aryl groups include, but are not limited to, phenyl, benzyl, chlorobenzyl, tolyl, and o-xylyl.

In the formulae and throughout the description, the term "alkenyl group" denotes a group which has one or more carbon-carbon double bonds and has from 2 to 10 or from 2 to 6 or from 3 to 4 carbon atoms.

In the formula and throughout the description, the term "alkynyl group" denotes a group which has one or more carbon-carbon triple bonds and has from 3 to 10 or from 3 to 6 or from 3 to 4 carbon atoms.

In the formula and throughout the description, the term "dialkylamino group" denotes a group which has two alkyl groups attached to a nitrogen atom and has from 1 to 10 or from 2 to 6 or from 2 to 4 carbon atoms. Exemplary aryl groups include, but are not limited to dimethylamino, diethylamino, and ethylmethylamino.

In the formula and throughout the description, the term "electron withdrawing group" denotes an atom or group thereof that acts to draw electrons away from the M-N bond. Examples of suitable electron withdrawing groups or substituents include, but are not limited to, nitriles (CN). In certain embodiments, an electron withdrawing substituent can be adjacent to or proximal to N in any one of Formula I. Further, non-limiting examples of an electron withdrawing group include F, Cl, Br, I, CN, $NO_2$, RSO, and/or $RSO_2$, wherein R can be a $C_1$ to $C_{10}$ alkyl group such as, for example, a methyl group.

Throughout the description, the term "non-hydrogen containing nitrogen plasma" denotes a plasma does not having any hydrogen atom. Examples include, but are not limited, nitrogen plasma, a plasma comprising nitrogen and helium, a plasma comprising nitrogen and argon, a plasma comprising nitrogen and neon. The nitrogen content in the plasma can vary from 0.01 to 100%. Exemplary nitrogen contents include, but are not limited to, 5% nitrogen and 95% helium, 5% nitrogen and 95% argon, 10% nitrogen and 90% helium, 10% nitrogen and 90% argon, 15% nitrogen and 85% helium, 15% nitrogen and 85% argon, 20% nitrogen and 80% helium, 20% nitrogen and 80% argon, 25% nitrogen and 75% helium, 25% nitrogen and 75% argon, 30% nitrogen and 70% helium, 30% nitrogen and 70% argon, 40% nitrogen and 60% helium, 40% nitrogen and 60% argon, 50% nitrogen and 50% helium, 50% nitrogen and 50% argon, 60% nitrogen and 40% argon, 60% nitrogen and 40% helium, 70% nitrogen and 30% argon, 70% nitrogen and 30% helium, 80% nitrogen and 20% argon, 80% nitrogen and 20% helium, 90% nitrogen and 10% argon, 90% nitrogen and 10% helium, 95% nitrogen and 5% argon, 95% nitrogen and 5% helium, 100% nitrogen.

Throughout the description, the term "conformal" as used herein is defined as a percentage of two thicknesses of the deposited aluminum nitride, boron nitride, gallium nitride, Group 13 element doped metal nitride film in a structured or featured substrate having either vias or trenches or both, with bottom step coverage being the ratio (in %): thickness at the bottom of the feature is divided by thickness at the top of the feature, and middle step coverage being the ratio (in %): thickness on a sidewall of the feature is divided by thickness at the top of the feature. Films deposited using the method described herein exhibit a step coverage of about 60% or greater, about 70% or greater, about 80% or greater, or about 90% or greater which indicates that the films are conformal.

In certain embodiments, one or more of the alkyl group, alkenyl group, alkynyl group, alkoxy group, dialkylamino group, aryl group, and/or electron withdrawing group in Formulae I through III may be substituted or have one or more atoms or group of atoms substituted in place of a hydrogen atom. Exemplary substituents include, but are not limited to, oxygen, sulfur, halogen atoms (e.g., F, Cl, I, or Br), nitrogen, and phosphorous. For example, the term "fluorinated alkyl group" denotes a group wherein the alkyl group has one or more of its atoms such, as a hydrogen atom, substituted with a fluorine atom.

Exemplary Group 13 metal or metalloid precursors include, but are not limited to, trimethylaluminum, triethylaluminum, tris(dimethylamino)aluminum, tris(ethylmethylamino)aluminum, trimethylborane, triethylborane, tris(dimethylamino)borane, tris(ethylmethylamino)borane, and tris(diethylamino)borane. Further exemplary Group 13 metalloid precursors include a "borane organoamine complex". A "borane organoamine complex" denotes a stable and volatile borane complex formed by reacting borane or diborane with an organoamine. Exemplary organoamine borane complexes include, but are not limited to, borane trimethylamine complex, borane triethylamine complex, dimethylamine borane, borane pyridine complex, borane morpholine complex, borane tert-butylamine complex, borane 4-methylmorpholine complex, borane N,N-diisopropylethylamine complex, borane ethylenediamine complex, and 2-Methylpyridine borane complex.

The process used to form Group 13 metal or metalloid nitride or metal doped metalloid films include any suitable deposition processes. Examples of suitable deposition processes include, but are not limited to, plasma enhanced ALD (PEALD) or PEALD-like process. As used herein, the term "chemical vapor deposition processes" refers to any process wherein a substrate is exposed to one or more volatile precursors, which react and/or decompose on the substrate surface to produce the desired deposition. As used herein, the term "atomic layer deposition process" refers to a self-limiting (e.g., the amount of film material deposited in each reaction cycle is constant), sequential surface chemistry that deposits films of materials onto substrates of varying compositions. Although the precursors, reagents and sources used herein may be sometimes described as "gaseous," it is understood that the precursors can be either liquid or solid which are transported with or without an inert gas into the reactor via direct vaporization, bubbling or sublimation. In some case, the vaporized precursors can pass through a plasma generator. The term "reactor" as used herein, includes without limitation, reaction chamber or deposition chamber such as a single wafer ALD reactor, semi-batch ALD reactor, or batch furnace ALD reactor; b) each reactant including aluminum precursor or boron precursor or metal precursor and reactive gas is exposed to a substrate by moving or rotating the substrate to different sections of the reactor and each section is separated by inert gas curtain, i.e. spatial ALD reactor or roll to roll ALD reactor. The "PEALD-like" process is defined herein as a plasma enhanced cyclic CVD process that provides a high conformal aluminum nitride or boron nitride or metal doped aluminum nitride or metal doped boron nitride film on a substrate as shown by having at least one of the following: percentage of non-uniformity of about 5% or less as measured by ellipsometer, a deposition rate of 0.1 Å or greater per cycle, or a combination thereof.

In certain embodiments, the method disclosed herein avoids pre-reaction of the precursors by using PEALD or PEALD-like methods that separate the precursors prior to and/or during the introduction to the reactor. In this connection, deposition techniques such as PEALD or PEALD-like processes are used to deposit Group 13 metal or metalloid nitride film. In one embodiment, the film is deposited via a PEALD process by exposing the substrate surface alternatively to the one or more aluminum nitride precursor, nitrogen-containing source, or other precursor or reagent. Film growth proceeds by self-limiting control of surface reaction, the pulse length of each precursor or reagent, and the deposition temperature. However, once the surface of the substrate is saturated, the film growth ceases.

Depending upon the deposition method, in certain embodiments, the at least one Group 13 metal or metalloid precursors may be introduced into the reactor at a predetermined molar volume such as, for example, from about 0.1 to about 1000 micromoles. In this embodiment, the at least one aluminum precursor may be introduced into the reactor for a predetermined time period. In certain embodiments, the time period ranges from about 0.001 to about 500 seconds.

In certain embodiments, the Group 13 metal or metalloid nitride films comprise aluminum and/or nitrogen or boron and/or nitrogen. In these embodiments, the aluminum or boron nitride films deposited using the methods described herein are formed in the presence of nitrogen-containing source. A nitrogen-containing source may be introduced into the reactor in the form of at least one nitrogen-containing source and/or may be present incidentally in the other precursors used in the deposition process. Suitable nitrogen-containing source gases may include, for example, a nitrogen/argon plasma. In certain embodiments, the nitrogen-containing source comprises a nitrogen/argon plasma source gas that is introduced into the reactor at a flow rate ranging from about 1 to about 2000 standard cubic centimeters (sccm) or from about 1 to about 1000 sccm. The nitrogen-containing source can be introduced for a time that ranges from about 0.1 to about 100 seconds. In embodiments wherein the film is deposited by an ALD or a cyclic CVD process, the precursor pulse can have a pulse duration that is greater than 0.01 seconds, and the nitrogen-containing source can have a pulse duration that is less than 0.01 seconds, while the water pulse duration can have a pulse duration that is less than 0.01 seconds. In yet another embodiment, the purge duration between the pulses that can be as low as 0 seconds or is continuously pulsed without a purge in-between.

In the method described herein, a nitrogen-containing plasma comprising a nitrogen containing gas such as, without limitation, nitrogen and optionally a noble gas can be generated in situ or remotely, preferably a noble gas with an atomic mass greater than nitrogen's atomic mass (i.e., 28 amu). The presence of a noble gas with atomic mass greater than nitrogen's atomic mass is believed to create more atomic nitrogen radicals. The nitrogen plasma source gas is introduced into the reactor at a flow rate ranging from about 1 to about 2000 square cubic centimeters (sccm) or from about 1 to about 1000 sccm or more. The nitrogen containing plasma can be introduced for a time that ranges from about 0.01 to about 100 seconds or more. In embodiments, the precursor pulse can have a pulse duration that is greater than 0.01 seconds, and the nitrogen-containing plasma can have a pulse duration that is less than 0.01 seconds, while the water pulse duration can have a pulse duration that is less than 0.01 seconds. In yet another embodiment, the purge duration between the precursor pulse and nitrogen plasmas that can be as low as 0 seconds. In yet another embodiment, a hydrogen plasma can be generated in situ or remotely using pure hydrogen ($H_2$)) mixed with a noble gas when a hydrogen plasma can be employed. The weight percentage of the noble gas in the plasma containing both nitrogen and noble gas can vary from 1 wt % to 99 wt % whereas the weight percentage of the noble gas in the plasma containing both hydrogen and noble gas can also vary from 1 wt % to 99 wt %.

As demonstrated in the working examples herein, conventional nitrogen containing plasma disclosed in the prior art such as ammonia plasma and hydrogen/nitrogen plasma could not provide high quality Group 13 metal or metalloid nitride films using existing aluminum or boron precursors such as tris(dimethylamino)aluminum or tris(dimethylamino)borane. Without being bound by a particular theory, it is believed the plasma containing only nitrogen or both nitrogen and a noble gas such as helium or argon can help the formation of Group 13 metal or metalloid films such as an aluminum or boron nitride film as well as provide reactive sites on at least a portion of the chemisorbed surface for aluminum or boron precursors having Formula I in subsequent deposition cycles to anchor onto these reactive sites. This enables the cyclical, deposition to occur whereas conventional nitrogen containing plasma such as ammonia plasma and/or hydrogen/nitrogen plasma may poison the surface, thereby resulting in minimum film deposition. Not being bound by any theory, the plasma density which is defined by plasma power over area of electrodes (for example, plasma power of 450 W for a 6" wafer ALD reactor, the plasma density is about 2.5 $W/cm^2$, assuming the area of electrode is same as the wafer) and is preferably lower than 2 $W/cm^2$ in order to reduce potential plasma damage on the substrate as well as any built-in structures on the substrate, yet still produce high quality aluminum nitride film which can be implemented into semi-conductor manufacturing processes. The plasma density of the method described herein ranges from about 0.01 to about 2 $W/cm^2$, or from about 0.01 to about 1.5 $W/cm^2$, or from about 0.01 to 1 $W/cm^2$. Typical plasma frequency ranges from 10 KHz to 2.4 GHz, preferably 10 kHz to 60 MHz. In some embodiments, dual RF plasma can be employed, one low frequency ranging from 10 kHz to 1 MHz and the other middle frequency selected from group consisting of 13.56 MHz and 27.1 MHz.

The deposition methods described herein may involve one or more purge gases. The purge gas, which is used to purge away unconsumed reactants and/or reaction byproducts, is an inert gas that does not react with the precursors. Exemplary purge gases include, but are not limited to, argon (Ar), nitrogen ($N_2$), helium (He), neon (Ne), hydrogen ($H_2$), and mixtures thereof. In certain embodiments, the inert gas that is used as a purge gas comprises a noble gas. The term "noble gas" as used herein means those gases found in Group 18 of the Periodic Table and include, helium (He), neon (Ne), argon (Ar), Xenon (Xe), krypton (Kr), and mixtures thereof. In one particular embodiment, the noble gas used as a purge gas comprises argon. In this or other embodiments, the purge gas comprising Ar is supplied into the reactor at a flow rate ranging from about 10 to about 2000 sccm for about 0.1 to 1000 seconds, thereby purging the unreacted precursor material and any byproduct that may remain in the reactor.

The respective step of supplying the precursors, the nitrogen-containing source, and/or other precursors, source gases, and/or reagents may be performed by changing the time for supplying them to change the stoichiometric composition of the resulting aluminum nitride film.

Energy is applied to the at least one of the precursor, nitrogen-containing source, reducing agent, other precursors or combination thereof to induce reaction and to form the aluminum nitride film or coating on the substrate. Such energy can be provided by, but not limited to, thermal, plasma, pulsed plasma, helicon plasma, high density plasma, inductively coupled plasma, X-ray, e-beam, photon, remote plasma methods, and combinations thereof. In certain embodiments, a secondary RF frequency source can be used to modify the plasma characteristics at the substrate surface.

In embodiments wherein the deposition involves plasma, the plasma-generated process may comprise a direct plasma-generated process in which plasma is directly generated in the reactor, or alternatively a remote plasma-generated process in which plasma is generated outside of the reactor and supplied into the reactor.

The Group 13 metal or metalloid precursors may be delivered to the reaction chamber such as a PEALD or PEALD-like reactor either single wafer or batch in a variety of ways such as bubbling, vapor draw, or direct liquid injection (DLI). In one embodiment, a liquid delivery system may be utilized. In an alternative embodiment, a combined liquid delivery and flash vaporization process unit may be employed, such as, for example, the turbo vaporizer manufactured by MSP Corporation of Shoreview, Minn., to enable low volatility materials to be volumetrically delivered, which leads to reproducible transport and deposition without thermal decomposition of the precursor. In liquid delivery formulations, the precursors described herein may be delivered in neat liquid form, or alternatively, may be employed in solvent formulations or compositions comprising same. Thus, in certain embodiments the precursor formulations may include solvent component(s) of suitable character as may be desirable and advantageous in a given end use application to form a film on a substrate.

In certain embodiments, gas lines connecting from the precursor canisters to the reaction chamber are heated to one or more temperatures depending upon the process requirements and the container of the aluminum precursor having the formulae I through III described herein is kept at one or more temperatures for bubbling. In other embodiments, a solution comprising the at least one aluminum nitride precursor having the formula described herein is injected into a vaporizer kept at one or more temperatures for direct liquid injection.

A flow of argon and/or other inert gas may be employed as a carrier gas to help deliver the vapor of the at least one aluminum precursor to the reaction chamber during the precursor pulsing. In certain embodiments, the reaction chamber process pressure is about 2 Torr or less. In other embodiments, the reaction chamber process pressure is about 10 Torr or less. In other embodiments, the reaction chamber process pressure is about 200 Torr or less.

In a typical PEALD or PEALD-like process, a substrate such as, without limitation, a silicon oxide, carbon doped silicon oxide, flexible substrate, or metal nitride substrate is heated on a heater stage in a reaction chamber that is exposed to the aluminum nitride precursor initially to allow the aluminum to chemically adsorb onto the surface of the substrate. A purge gas such as nitrogen, argon, or other inert gas purges away unabsorbed excess aluminum from the process chamber. After sufficient purging, an nitrogen-containing source may be introduced into reaction chamber to react with the absorbed surface followed by another gas purge to remove reaction by-products from the chamber. The process cycle can be repeated to achieve the desired film thickness. In other embodiments, pumping under vacuum can be used to remove unabsorbed excess aluminum from the process chamber, after sufficient evacuation under pumping, a nitrogen-containing source may be introduced into reaction chamber to react with the absorbed surface followed by another pumping down purge to remove reaction by-products from the chamber.

In one aspect, there is provided a method of forming a Group 13 nitride films selected from the group consisting of aluminum nitride, boron nitride, gallium nitride, indium nitride, thallium nitride and combinations thereof, the method comprising the steps of:

a. providing a substrate in a reactor;
b. introducing into the reactor an at least one Group 13 precursor represented by the following Formula I:

$$MR_n(NR^1R^2)_{3-n} \quad \text{I}$$

wherein M is selected from the group consisting of boron (B), aluminum (Al), gallium (Ga), indium (In), thallium (Th), and combinations thereof; R is selected from a linear or branched $C_1$ to $C_{10}$ alkyl group, a linear or branched $C_2$ to $C_{10}$ alkenyl group, a linear or branched $C_2$ to $C_{10}$ alkynyl group, a $C_1$ to $C_6$ dialkylamino group, an electron withdrawing group, and a $C_6$ to $C_{10}$ aryl group; $R^1$ is selected from hydrogen, a linear or branched C, to $C_{10}$ alkyl group, a linear or branched $C_3$ to $C_{10}$ alkenyl group, a linear or branched $C_3$ to $C_{10}$ alkynyl group, a $C_1$ to $C_6$ dialkylamino group, an electron withdrawing group, and a $C_6$ to $C_{10}$ aryl group; $R^2$ is selected from a linear or branched $C_1$ to $C_{10}$ alkyl group, a linear or branched $C_3$ to $C_6$ alkenyl group, a linear or branched $C_4$ to $C_6$ alkynyl group, a $C_1$ to $C_6$ dialkylamino group, a $C_6$ to $C_{10}$ aryl group, a linear or branched $C_1$ to $C_6$ fluorinated alkyl group, an electron withdrawing group, and a $C_4$ to $C_{10}$ aryl group; optionally wherein $R^1$ and $R^2$ are linked together to form a ring selected from a substituted or unsubstituted aromatic ring or a substituted or unsubstituted aliphatic ring; and wherein n=0, 1, 2 or 3, wherein the at least one aluminum precursor reacts on at least a portion of the surface of the substrate to provide a chemisorbed layer;
c. purging the reactor with a purge gas;
d. introducing a plasma comprising nitrogen plasma into the reactor to react with at least a portion of the chemisorbed layer and provide at least one reactive site wherein the plasma is generated at a power density ranging from about 0.01 to about 1.5 W/cm$^2$; and
e. optionally purging the reactor with an inert gas; and wherein the steps b through e are repeated until a desired thickness of the Group 13 metal or metalloid nitride film is obtained. In certain embodiments, $R^1$ and $R^2$ are the same. In other embodiments, $R^1$ and $R^2$ are different. In the foregoing or other embodiments, $R^1$ and $R^2$ can be linked together to form a ring. Examples of the ring include but not limited to, pyrrolidino wherein $R^1$=$R^2$=linear $C_2$ alkyl, 2,5-dimethyl-pyrrolidino wherein $R^1$=$R^2$=branched $C_3$ alkyl, piperidino wherein $R^1$=$R^2$=linear $C_3$ alkyl, 2,6-dimethylpiperidino wherein $R^1$=branched $C_3$ alkyl and $R^2$=branched $C_4$ alkyl. In yet further embodiments, $R^1$ and $R^2$ are not linked together to form a ring. Optionally a plasma comprising hydrogen can be inserted before step d to help removing hydrocarbon generated from the reaction between the Group 13 precursor and the surface. In certain embodiments, the plasma comprising nitrogen is selected from the group consisting of nitrogen plasma, nitrogen/helium, nitrogen/argon plasma, nitrogen/neon plasma and mixtures thereof. In alternative embodiments, the plasma comprises a non-hydrogen plasma.

In another aspect, there is provided a method of forming an aluminum nitride film via plasma enhanced atomic layer deposition process or PEALD-like process, the method comprising the steps of:

a. providing a substrate in a reactor;
b. introducing into the reactor at least one aluminum precursor is selected from the group consisting of trimethylaluminum, triethylaluminum, tris(dimethylamino)aluminum, and tris(ethylmethylamino)aluminum wherein the at least one aluminum precursor reacts on at least a portion of the surface of the substrate to provide a chemisorbed layer;
c. purging the reactor with a purge gas comprising at least one selected from nitrogen, a noble gas, and combinations thereof;
d. introducing a plasma comprising non-hydrogen containing nitrogen plasma into the reactor to react with at least a portion of the chemisorbed layer and provide at least one reactive site wherein the plasma is generated at a power density ranging from about 0.01 to about 1.5 W/cm$^2$; and
e. optionally purging the reactor with an inert gas; and wherein the steps b through e are repeated until a desired thickness of the aluminum nitride film is obtained.

In another aspect, there is provided a method of forming a boron nitride film via plasma enhanced atomic layer deposition process or PEALD-like process, the method comprising the steps of:

a. providing a substrate in a reactor;
b. introducing into the reactor at least one boron precursor is selected from the group consisting of trimethylborane, triethylborane, tris(dimethylamino)borane, tris(ethylmethylamino)borane, tris(diethylamino)borane, and a borane organoamine complex wherein the at least one boron precursor reacts on at least a portion of the surface of the substrate to provide a chemisorbed layer;
c. purging the reactor with a purge gas comprising at least one selected from nitrogen, a noble gas, and combinations thereof;
d. introducing a plasma comprising non-hydrogen containing nitrogen plasma into the reactor to react with at least a portion of the chemisorbed layer and provide at least one reactive site wherein the plasma is generated at a power density ranging from about 0.01 to about 1.5 W/cm$^2$; and
e. optionally purging the reactor with an inert gas; and wherein the steps b through e are repeated until a desired thickness of the boron nitride film is obtained.

In another aspect, there is provided a method of forming a Group 13 nitride having two different Group 13 elements such as a boron doped aluminum nitride film via plasma enhanced atomic layer deposition process or PEALD-like process, the method comprising the steps of:

a. providing a substrate in a reactor;
b. introducing into the reactor at least one aluminum precursor is selected from the group consisting of trimethylaluminum, triethylaluminum, tris(dimethylamino)aluminum, and tris(ethylmethylamino)aluminum wherein the at least one aluminum precursor reacts on at least a portion of the surface of the substrate to provide a chemisorbed layer;
c. purging the reactor with a purge gas comprising at least one selected from nitrogen, a noble gas, and combinations thereof;
d. introducing a plasma comprising non-hydrogen containing nitrogen plasma into the reactor to react with at least a portion of the chemisorbed layer and provide at least one reactive site wherein the plasma is generated at a power density ranging from about 0.01 to about 1.5 W/cm$^2$;
e. purging the reactor with a purge gas comprising at least one selected from nitrogen, a noble gas, and combinations thereof;
f. introducing into the reactor at least one Group 13 precursor other than aluminum such as boron precursor is selected from the group consisting of trimethylborane, triethylborane, tris(dimethylamino)borane, tris(ethylmethylamino)borane, tris(diethylamino)borane, and borane organoamine complex wherein the at least one Group 13 precursor reacts on at least a portion of the surface of the substrate to provide a chemisorbed layer;

g. purging the reactor with a purge gas comprising at least one selected from nitrogen, a noble gas, and combinations thereof;

h. introducing a plasma comprising non-hydrogen containing nitrogen plasma into the reactor to react with at least a portion of the chemisorbed layer and provide at least one reactive site wherein the plasma is generated at a power density ranging from about 0.01 to about 1.5 W/cm$^2$ and i. optionally purging the reactor with an inert gas; and wherein the steps b through e are repeated until a desired thickness of the boron doped aluminum nitride film is obtained.

The above steps define one cycle for the method described herein; and the cycle can be repeated until the desired thickness of the film is obtained. In this or other embodiments, it is understood that the steps of the methods described herein may be performed in a variety of orders, may be performed sequentially or concurrently (e.g., during at least a portion of another step), and any combination thereof. The respective step of supplying the precursors and nitrogen-containing source may be performed by varying the duration of the time for supplying them to change the stoichiometric composition of the resulting nitride film, although always using nitrogen in less than a stoichiometric amount relative to the available Group 13 metal or metalloid.

In another aspect, there is provided a method of forming a Group 13 element doped metal nitride such as aluminum doped titanium nitride, boron doped titanium nitride, aluminum doped tantalum nitride, boron doped tantalum nitride, aluminum doped tungsten nitride, boron doped tungsten nitride, aluminum doped vanadium nitride, boron doped vanadium nitride film via plasma enhanced atomic layer deposition process or PEALD-like process, the method comprising the steps of:

a. providing a substrate in a reactor;

b. introducing into the reactor at least one aluminum precursor is selected from the group consisting of trimethylaluminum, triethylaluminum, tris(dimethylamino)aluminum, tris(ethylmethylamino)aluminum, trimethylborane, triethylborane, tris(dimethylamino)borane, tris(ethylmethylamino)borane, tris(diethylamino)borane, and borane organoamine complex wherein the at least one aluminum or boron precursor reacts on at least a portion of the surface of the substrate to provide a chemisorbed layer;

c. purging the reactor with a purge gas comprising at least one selected from nitrogen, a noble gas, and combinations thereof;

d. introducing a plasma comprising non-hydrogen containing nitrogen plasma into the reactor to react with at least a portion of the chemisorbed layer and provide at least one reactive site wherein the plasma is generated at a power density ranging from about 0.01 to about 1.5 W/cm$^2$;

e. purging the reactor with a purge gas comprising at least one selected from nitrogen, a noble gas, and combinations thereof;

f. introducing into the reactor at least one metal precursor is selected from the group consisting zirconium chloride (ZrCl$_4$), tetrakis(dimethylamino)zirconium (TDMAZ), tetrakis(diethylamino)zirconium (TDEAZ), tetrakis(ethylmethylamino)zirconium (TEMAZ), tetrakis(dimethylamino)hafnium (TDMAH), tetrakis(diethylamino)hafnium (TDEAH), and tetrakis(ethylmethylamino)hafnium (TEMAH), titanium chloride (TiCl$_4$), tetrakis(dimethylamino)titanium (TDMAT), tetrakis(diethylamino)titanium (TDEAT), tetrakis(ethylmethylamino)titanium (TEMAT), tantalum chloride (TaCl$_5$), tert-butylimino tri(diethylamino) tantalum (TBTDET), tert-butylimino tri(dimethylamino) tantalum (TBTDMT), tert-butylimino tri(ethylmethylamino)tantalum (TBTEMT), ethylimino tri(diethylamino) tantalum (EITDET), ethylimino tri(dimethylamino)tantalum (EITDMT), ethylimino tri(ethylmethylamino)tantalum (EITEMT), tert-amylimino tri(dimethylamino)tantalum (TAIMAT), tert-amylimino tri(diethylamino)tantalum, pentakis (dimethylamino)tantalum, tert-amylimino tri (ethylmethylamino)tantalum, tungsten hexachloride, tungsten pentachloride, bis(tert-butylimino)bis(dimethylamino)tungsten (BTBMW), bis(tert-butylimino)bis(diethylamino)tungsten, bis(tert-butylimino)bis(ethylmethylamino) tungsten, and combinations thereof wherein the at least one metal precursor reacts on at least a portion of the surface of the substrate to provide a chemisorbed layer;

g. purging the reactor with a purge gas comprising at least one selected from nitrogen, a noble gas, and combinations thereof;

h. introducing a plasma comprising non-hydrogen containing nitrogen plasma into the reactor to react with at least a portion of the chemisorbed layer and provide at least one reactive site wherein the plasma is generated at a power density ranging from about 0.01 to about 1.5 W/cm$^2$; and i. optionally purging the reactor with an inert gas, wherein the steps b through e are repeated until a desired thickness of the aluminum or boron doped metal nitride film is obtained.

The above steps define one cycle for the method described herein and the cycle can be repeated until the desired thickness of the film is obtained. In this or other embodiments, it is understood that the steps of the methods described herein may be performed in a variety of orders, may be performed sequentially or concurrently (e.g., during at least a portion of another step), and any combination thereof. The respective step of supplying the precursors and nitrogen-containing source may be performed by varying the duration of the time for supplying them to change the stoichiometric composition as well as physical properties of the resulting boron or aluminum doped metal nitride film which can be employed as gate electrode or diffusion barrier in fabrication of semi-conductor devices.

In certain embodiments of the method described herein, steps b to e are repeated to provide the Group 13 metal, metalloid or Group 13 doped metal nitride film with a thickness ranging from about 0.1 to about 500 Å, or from about 0.1 to about 5 Å, or from about 0.1 to about 10 Å, or about 0.1 to about 50 Å, or 0.1 to 100 Å. In one particular embodiment of the method described herein, a plasma comprising hydrogen selected from the group consisting of hydrogen plasma, hydrogen/helium, hydrogen/argon plasma, hydrogen/neon plasma and mixtures thereof can be inserted before step d or h to help removing hydrocarbon generated from the reaction between the aluminum or boron precursor and the surface. In an alternative embodiment, the plasma comprises a non-hydrogen plasma. In some embodiment, steps f to i can be repeated many times before step b to e, creating a nanolaminate conducting material comprising an alternating metal nitride and aluminum or boron nitride with lower aluminum or boron content (i.e. aluminum or boron content is 15 at % or 10 at % or less, 5% at or less based on XPS measurement). The resulting aluminum or boron doped metal can provide proper physical properties such as work function or resistivity suitable for gate electrode or diffusion barrier or heating material in processes for fabricating semi-conductor devices.

In certain embodiments, the resultant Group 13 metal or metalloid or Group 13 doped metal nitride films or coatings can be exposed to a post-deposition treatment such as, but not limited to, thermal annealing at temperature ranging from 300 to 1000° C., a plasma treatment such as hydrogen, helium plasma, argon plasma and combination thereof, chemical treatment, ultraviolet light (UV) exposure, infrared light (IR) exposure, electron beam exposure, and/or other treatments to improve one or more properties of the film.

As mentioned previously, the method described herein may be used to deposit a Group 13 metal, metalloid nitride or Group 13 doped metal nitride film on at least a portion of a substrate. Examples of suitable substrates include but are not limited to, silicon, germanium, $SiO_2$, $Si_3N_4$, OSG, FSG, silicon carbide, hydrogenated silicon carbide, silicon nitride, hydrogenated silicon nitride, silicon carbonitride, hydrogenated silicon carbonitride, boronitride, antireflective coatings, photoresists, a flexible substrate such as IGZO, organic polymers, porous organic and inorganic materials, metals such as copper and aluminum, and diffusion barrier layers such as but not limited to TiN, Ti(C)N, TaN, Ta(C)N, Ta, W, or WN. The films are compatible with a variety of subsequent processing steps such as, for example, chemical mechanical planarization (CMP) and anisotropic etching processes.

The deposited films have applications that include, but are not limited to, computer chips, optical devices, magnetic information storages, coatings on a supporting material or substrate, microelectromechanical systems (MEMS), nanoelectromechanical systems, thin film transistor (TFT), light emitting diodes (LED), organic light emitting diodes (OLED), IGZO, and liquid crystal displays (LCD).

The following examples illustrate the method for depositing aluminum nitride, boron nitride, aluminum doped metal nitride or boron doped metal nitride films described herein and are not intended to limit it in any way.

EXAMPLES

In the following examples, unless stated otherwise, properties were obtained from sample films that were deposited onto medium resistivity (14-17 Ω-cm) single crystal silicon wafer substrates. All film depositions were performed using the CN-1 reactor has showerhead design with 13.56 MHz direct plasma or the cross flow type CN-1 reactor without plasma (for comparative examples). In typical process conditions, unless stated otherwise, the chamber pressure was fixed at a pressure ranging from about 1 to about 5 Torr. Additional inert gas was used to maintain chamber pressure. The aluminum precursor was delivered using vapor draw (i.e., no argon used at all) Typical RF power used was 125 W over electrode area of 150 mm wafer to provide a power density of 0.7 W/cm². The film depositions comprised the steps listed in Table 1 and 2 for thermal ALD and plasma enhanced ALD, respectively. Steps 1 through 4 in Table 2 constitute one PEALD cycle and were repeated, unless otherwise specified, a total of 100 times to get the desired film thickness.

TABLE 1

| Steps used in thermal ALD aluminum nitride films | |
| --- | --- |
| Step | |
| 1 | Introduce an aluminum precursor to the reactor; additional inert gas is used to maintain chamber pressure to provide a chemisorbed layer |
| 2 | Purge the aluminum precursor from the reactor chamber with inert gas |
| 3 | Introduce ammonia react with the surface of the chemisorbed layer and create reactive sites |
| 4 | Purge unreacted plasma species out |

TABLE 2

| Steps used in PEALD aluminum nitride films | |
| --- | --- |
| Step | |
| 1 | Introduce an aluminum precursor to the reactor; additional inert gas is used to maintain chamber pressure to provide a chemisorbed layer |
| 2 | Purge the aluminum precursor from the reactor chamber with inert gas |
| 3 | Activate a plasma to react with the surface of the chemisorbed layer and create reactive sites |
| 4 | Purge unreacted plasma species out |

The reactive index (RI) and thickness for the deposited films were measured using an ellipsometer. Film non-uniformity was calculated using the standard equation: % non-uniformity=((max thickness−min thickness)/(2*average (avg) thickness)). Film structure and composition were analyzed using Secondary ion mass spectrometry (SIMS). The density for the films was measured with X-ray Reflectometry (XRR).

Comparable Example 1

Thermal ALD aluminum nitride film using tri(dimethylamino)aluminum (TDMAA) with CN-1 cross flow type reactor and ammonia The silicon wafer was loaded into CN-cross flow type CN-1 reactor without plasma reactor and heated to from 150 to 350° C. with chamber pressure of 1 torr. TDMAA as aluminum precursor was delivered using bubbling method with Ar carrier gas flow rate of 50 sccm into the reactor. The ALD cycle was comprised of the process steps provided in Table 1 and using the following process parameters and repeated for 100 cycles:
1. Introduce an aluminum precursor to the reactor
   Argon flow: 1000 sccm
   Aluminum precursor pulse: 3 seconds
2. Inert gas purge
   Total flow of Argon 1000 sccm
   Purge time: 30 seconds
3. introduce ammonia
   Ar flow: 1000 sccm
   Ammonia flow: 500 sccm
   Ammonia pulse: 3 seconds
4. Purge
   Total flow of Argon: 1000 sccm
   Purge time: 30 seconds Comparable Example 2

Thermal ALD aluminum nitride film using tri(dimethylamino)aluminum (TDMAA) with CN-1 reactor equipped with showerhead design with 13.56 MHz direct plasma and ammonia The silicon wafer was loaded into the CN-1 reactor equipped with showerhead design with 13.56 MHz direct plasma and heated to from 100 to 400° C. with chamber pressure of 1 torr. TDMAA as aluminum precursor was delivered using bubbling method with Ar carrier gas flow rate of 50 sccm into the reactor. The PEALD cycle was comprised of the process steps provided in Table 2 and using the following process parameters repeated for 100 cycles:
1. Introduce an aluminum precursor to the reactor
   Argon flow: 1000 sccm
   Aluminum precursor pulse: 3 seconds
2. Inert gas purge
   Total flow of Argon 1000 sccm
   Purge time: 30 seconds
3. Introduce ammonia
   Ar flow: 1000 sccm
   Ammonia flow: 500 sccm
   Ammonia pulse: 3 seconds
4. Purge
   Total flow of Argon: 1000 sccm
   Purge time: 30 seconds Comparable Example 3

PEALD aluminum nitride film using tri(dimethylamino)aluminum (TDMAA) with CN-1 reactor equipped with showerhead design with 13.56 MHz direct plasma and ammonia plasma The silicon wafer was loaded into the CN-1 reactor equipped with showerhead design with 13.56 MHz direct plasma and heated to from 100 to 400° C. with chamber pressure of 1 torr. TDMAA as aluminum precursor was delivered using bubbling method with Ar carrier gas flow rate of 50 sccm into the reactor. The PEALD cycle was comprised of the process steps provided in Table 2 and using the following process parameters repeated for 100 cycles:
1. Introduce an aluminum precursor to the reactor
   Argon flow: 1000 sccm
   Aluminum precursor pulse: 3 seconds
2. Inert gas purge
   Total flow of Argon 1000 sccm
   Purge time: 30 seconds
3. Introduce ammonia
   Ar flow: 1000 sccm
   Ammonia flow: 500 sccm
   Ammonia pulse: 5 seconds with plasma power of 200 W
4. Purge
   Total flow of Argon: 1000 sccm
   Purge time: 30 seconds Example 1

PEALD aluminum nitride films using trimethylaminum (TMA) in CN-1 shower head type reactor and nitrogen plasma The silicon wafer was loaded into the CN-1 reactor equipped with showerhead design with 13.56 MHz direct plasma and heated to from 150 to 400° C. with chamber pressure of 1 torr. TMA as aluminum precursor was delivered using vapor draw method into the reactor. The PEALD cycle was comprised of the process steps provided in Table 2 and using the following process parameters repeated for 100 cycles:
1. Introduce an aluminum precursor to the reactor
   Nitrogen flow: 1000 sccm
   Aluminum precursor pulse: 3 seconds
2. Inert gas purge
   Total flow of nitrogen 1000 sccm
   Purge time: 30 seconds
3. Introduce plasma
   Nitrogen flow: 1000 sccm
   Plasma pulse: 5 seconds with plasma power of 200 W
4. Purge
   Total flow of Argon: 1000 sccm
   Purge time: 30 seconds Example 2

PEALD aluminum nitride films using tris(dimethylamino)aluminum (TDMAA) in CN-1 shower head type reactor and nitrogen plasma The silicon wafer was loaded into the CN-1 reactor equipped with showerhead design with 13.56 MHz direct plasma and heated to from 150 to 400° C. with chamber pressure of 1 torr. TDMAA as aluminum precursor was delivered using bubbling method with Ar carrier gas flow rate of 50 sccm into the reactor. The PEALD cycle was comprised of the process steps provided in Table 2 and using the following process parameters repeated for 100 cycles:
1. Introduce an aluminum precursor to the reactor
   Nitrogen flow: 1000 sccm
   Aluminum precursor pulse: 3 seconds
2. Inert gas purge
   Total flow of nitrogen 1000 sccm
   Purge time: 30 seconds
3. Introduce plasma
   Nitrogen flow: 1000 sccm
   Plasma pulse: 5 seconds with plasma power of 200 W
4. Purge
   Total flow of Argon: 1000 sccm
   Purge time: 30 seconds FIG. 1 provides a scanning electron microscope (SEM) image of AlN film deposited using tris(dimethylamino)aluminum and nitrogen plasma at 300° C., thus demonstrating almost 100% conformality.

Example 3

PEALD aluminum nitride films using tris(dimethylamino)aluminum (TDMAA) in CN-1 shower head type reactor and nitrogen/argon plasma The silicon wafer was loaded into the CN-1 reactor equipped with showerhead design with 13.56 MHz direct plasma and heated to from 100 to 350° C. with chamber pressure of 1 torr. TDMAA as aluminum precursor was delivered using bubbling method with Ar carrier gas flow rate of 50 sccm into the reactor. The PEALD cycle was comprised of the process steps provided in Table 2 and using the following process parameters repeated for 100 cycles:
1. Introduce an aluminum precursor to the reactor
   Nitrogen flow: 500 sccm
   Argon flow: 500 sccm
   Aluminum precursor pulse: 3 seconds
2. Inert gas purge
   Nitrogen flow: 500 sccm
   Argon flow: 500 sccm
   Purge time: 30 seconds
3. Introduce plasma
   Nitrogen flow: 500 sccm
   Argon flow: 500 sccm
   Plasma pulse: 5 seconds with plasma power of 200 W 4. Purge
   Nitrogen flow: 500 sccm
   Argon flow: 500 sccm
   Purge time: 30 seconds Example 4

Figure 3:
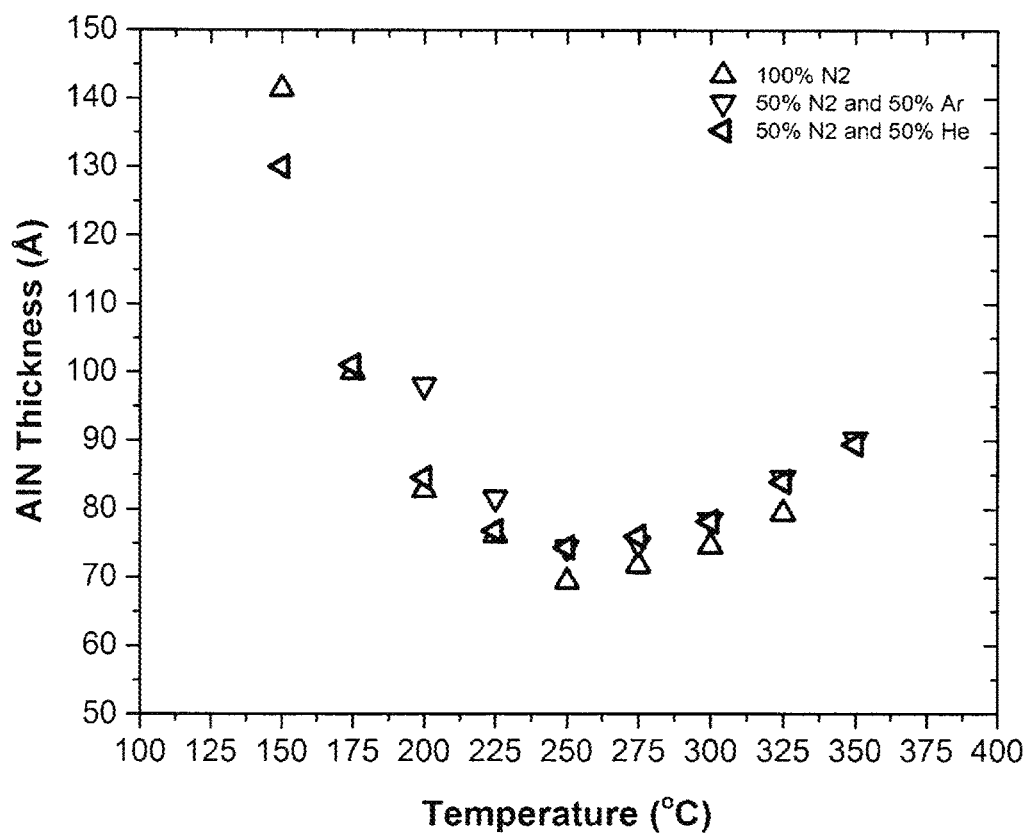
FIG. 3 shows AlN film deposited using tris(dimethylamino)aluminum and 100% nitrogen plasma, tris(dimethylamino)aluminum and 50% nitrogen/50% argon plasma, and 50% nitrogen/50% helium plasma, demonstrating ALD window from 200 to 350° C.
Figure 4:
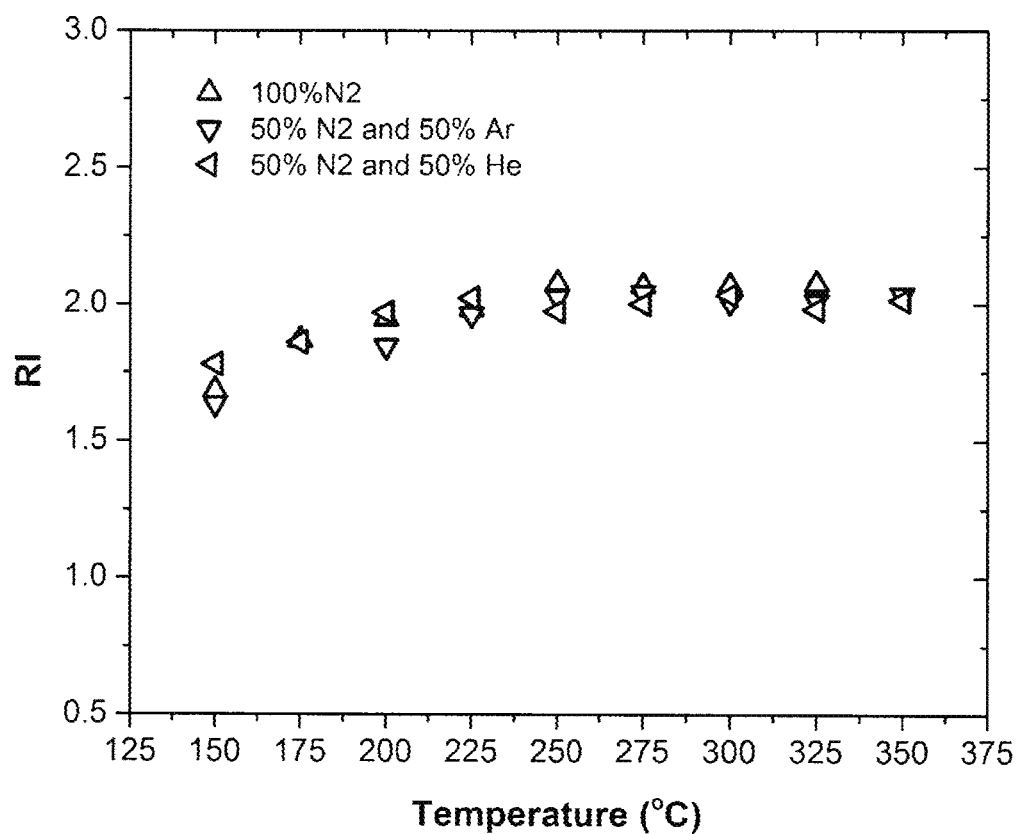
FIG. 4 shows reflective index (RI) of AlN film deposited using tris(dimethylamino)aluminum and 100% nitrogen plasma, tris(dimethylamino)aluminum and 50% nitrogen/50% argon plasma, and 50% nitrogen/50% helium plasma, demonstrating high quality AlN films with RI greater than 2.0 can be achieved. Table 3, 4 and 5 summarize ALN film properties.

PEALD aluminum nitride films using tris(dimethylamino)aluminum (TDMAA) in CN-1 shower head type reactor and nitrogen/helium plasma The silicon wafer was loaded into the CN-1 reactor equipped with showerhead design with 13.56 MHz direct plasma and heated to from 100 to 350° C. with chamber pressure of 1 torr. TDMAA as aluminum precursor was delivered using bubbling method with Ar carrier gas flow rate of 50 sccm into the reactor. The PEALD cycle was comprised of the process steps provided in Table 2 and using the following process parameters repeated for 100 cycles:
1. Introduce an aluminum precursor to the reactor
   Nitrogen flow: 500 sccm
   Helium flow: 500 sccm
   Aluminum precursor pulse: 3 seconds
2. Inert gas purge
   Nitrogen flow: 500 sccm
   Helium flow: 500 sccm
   Purge time: 30 seconds
3. Introduce plasma
   Nitrogen flow: 500 sccm
   Helium flow: 500 sccm
   Plasma pulse: 5 seconds with plasma power of 200 W
4. Purge
   Nitrogen flow: 500 sccm
   Helium flow: 500 sccm
   Purge time: 30 seconds FIG. 3 shows AlN films deposited using tris(dimethylamino)aluminum and 100% nitrogen plasma (Example 2), tris(dimethylamino)aluminum (Example 3) and 50% nitrogen/50% argon plasma, and 50% nitrogen/50% helium plasma (Example 4), demonstrating ALD window from 200 to 350° C. FIG. 4 shows reflective index (RI) of AlN film deposited using tris(dimethylamino)aluminum and 100% nitrogen plasma, tris(dimethylamino)aluminum and 50% nitrogen/50% argon plasma, and 50% nitrogen/50% helium plasma, demonstrating high quality AlN films with RI greater than 2.0 can be achieved. Tables 3 and 4 summarize AlN film properties.

TABLE 3

AlN Film Properties Using the CN-1 with shower head type reactor

| Run # | Temp °C. | RF Watts | at % N | at % Al | at % H | at % O | at % C | N/Al |
|---|---|---|---|---|---|---|---|---|
| TDMAA + NH$_3$ thermal or PEALD | | | | | | | | |
| 3783 | 300 | 0 | 37.23 | 34.31 | 25.33 | 1.03 | 2.06 | 1.08 |
| 3792 | 300 | 200 | 35.83 | 35.84 | 27.03 | 1.22 | 0.05 | 1.00 |
| 3796 | 350 | 0 | 34.39 | 35.65 | 27.19 | 0.78 | 1.95 | 0.96 |
| TDMAA + N$_2$ only PEALD | | | | | | | | |
| 3857 | 300 | 200 | 41.74 | 41.84 | 13.89 | 0.73 | 1.71 | 1.00 |
| 3908 | 350 | 200 | 42.24 | 44.6 | 11.34 | 0.54 | 1.25 | 0.95 |
| TDMAA + N$_2$/Ar PEALD | | | | | | | | |
| 3816 | 300 | 200 | 40.98 | 40.56 | 16.14 | 0.62 | 1.62 | 1.01 |
| 3827 | 350 | 200 | 41.69 | 43.17 | 13.28 | 0.46 | 1.31 | 0.97 |
| TMA + N$_2$ only PEALD | | | | | | | | |

TABLE 3-continued

AlN Film Properties Using the CN-1 with shower head type reactor

| Run # | Temp °C. | RF Watts | at % N | at % Al | at % H | at % O | at % C | N/Al |
|---|---|---|---|---|---|---|---|---|
| 3916 | 300 | 200 | 40.15 | 44.35 | 12.36 | 1.3 | 1.79 | 0.91 |
| 3924 | 350 | 200 | 41.31 | 45.85 | 9.69 | 1.85 | 1.26 | 0.90 |

TABLE 4

AlN Film Properties Using the CN-1 with shower head type reactor

| Deposition Condition | ALD Window, C. | Dep rate, Å/cy | RI value at 300° C. |
|---|---|---|---|
| TDMAA + NH$_3$ THALD | 225~275 | 0.73 at 275 C. | 1.87 |
| TDMAA + NH$_3$ PEALD | 200~275 | 0.65 at 275 C. | 2.00 |
| TDMAA + N$_2$ PEALD | 250~325 | 0.60 at 300 C. | 2.07 |
| TDMAA + N$_2$Ar(50%) PEALD | 250~325 | 0.67 at 300 C. | 2.01 |
| TDMAA + N$_2$He(50%) PEALD | 225~325 | 0.64 at 300 C. | 2.03 |
| TMA + N$_2$ PEALD | 200~325 | 0.72 at 300 C. | 2.05 |

Example 5

Figure 5:
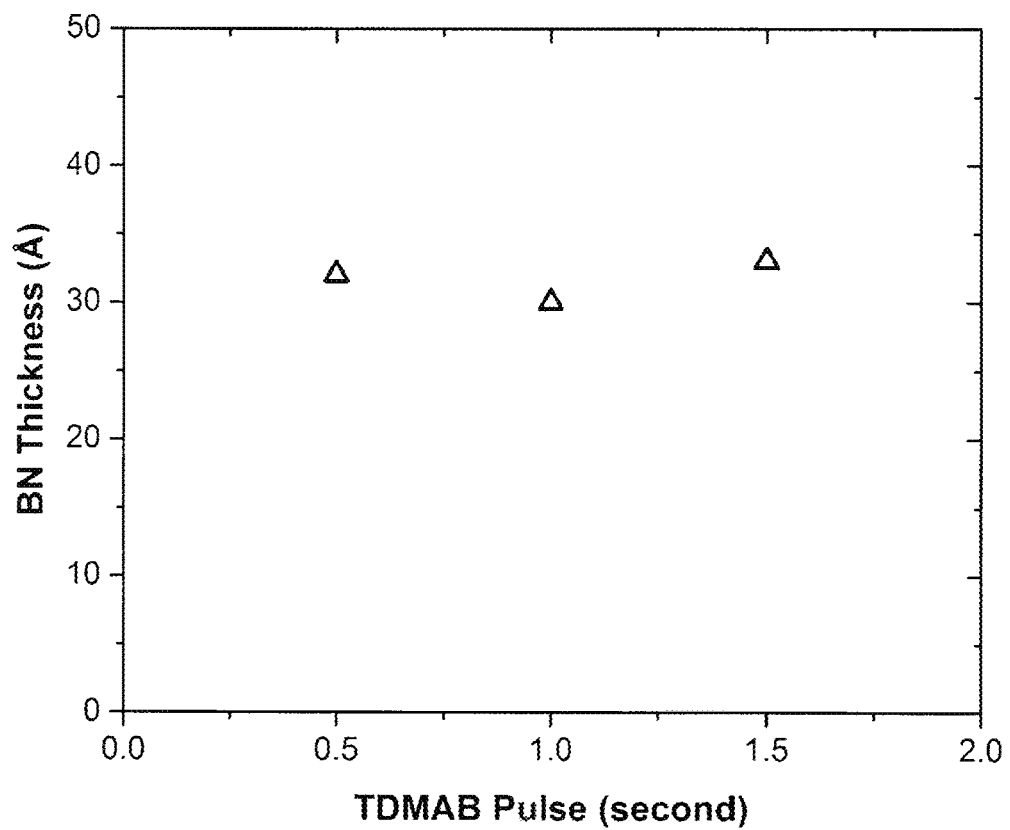
FIG. 5 shows thickness of BN films deposited using tris(dimethylamino)borane (TDMAB) and 100% nitrogen plasma vs TDMAB pulse time, demonstrating TDMAB reach self-limiting at 0.5 second.
Figure 6:
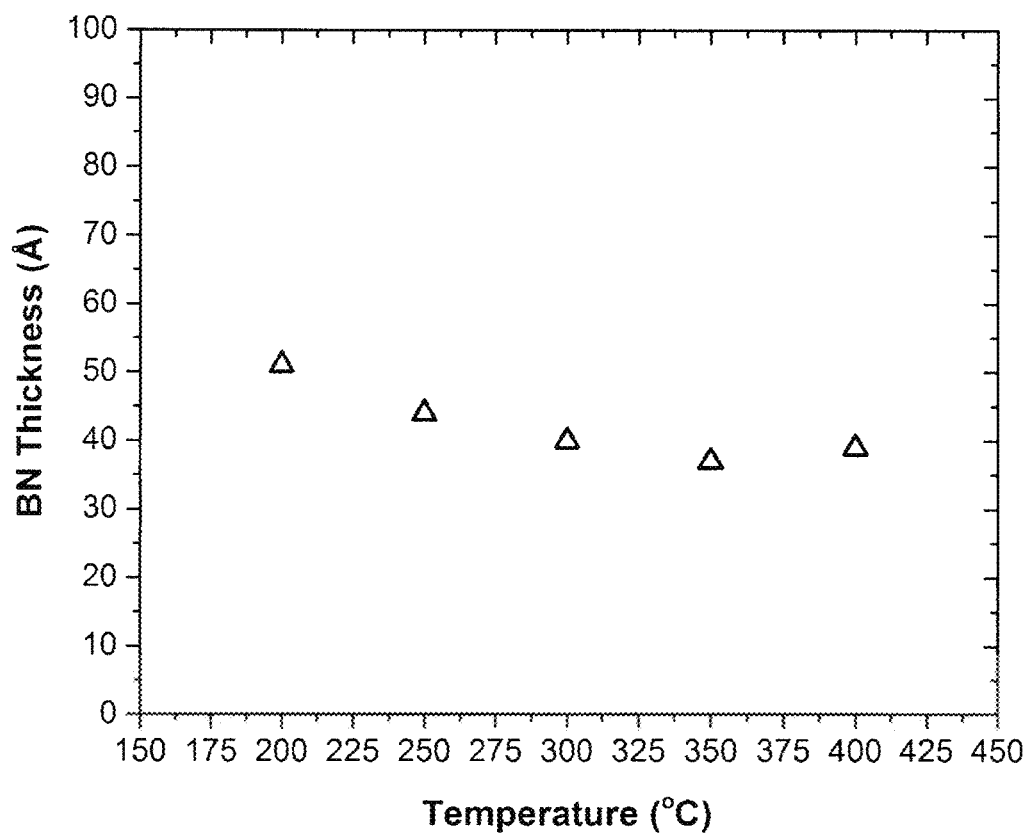
FIG. 6 shows BN films deposited using tris(dimethylamino)borane and 100% nitrogen plasma, demonstrating ALD window from 200 to 400° C.

PEALD boron nitride films using tris(dimethylamino)borane (TDMAB) in CN-1 shower head type reactor and nitrogen plasma The silicon wafer was loaded into the CN-1 reactor equipped with showerhead design with 13.56 MHz direct plasma and heated to from 200 to 400° C. with chamber pressure of 2 torr. TDMAB as boron precursor was delivered using vapor draw method into the reactor. The PEALD cycle was comprised of the process steps provided in Table 2 and using the following process parameters repeated for 200 cycles:
5. Introduce an aluminum precursor to the reactor
   Nitrogen flow: 1000 sccm
   Boron precursor pulse: 0.5 second
6. inert gas purge
   Total flow of nitrogen 1000 sccm
   Purge time: 10 seconds
7. Introduce plasma
   Nitrogen flow: 1000 sccm
   Plasma pulse: 10 second with plasma power of 125 W
8. Purge
   Total flow of Argon: 1000 sccm
   Purge time: 10 seconds FIG. 5 shows thickness of BN films deposited using tris(dimethylamino)borane (TDMAB) and 100% nitrogen plasma vs TDMAB pulse time, demonstrating TDMAB reach self-limiting at 0.5 second. FIG. 6 shows BN films deposited using tris(dimethylamino)borane and 100% nitrogen plasma, demonstrating ALD window from 200 to 400° C. In another set of experiments, the thickness of BN films vs number of cycles were conducted, the growth rate per cycle was determined from a graph of thickness vs number of cycles as 0.1 Å/cycle.

Example 6

PEALD aluminum doped titanium nitride film using tris(dimethylamino)aluminum (TDMAA) and tetrakis(dimethylamino)titanium (TDMAT), and nitrogen plasma The silicon wafer was loaded into the CN-1 reactor equipped with showerhead design with 13.56 MHz direct plasma and heated to 300° C. with chamber pressure of 2 torr. Plasma power was at at 125 W. Tris(dimethylamino)aluminum (TDMAA) as aluminum precursor and tetrakis(dimethylamino)titanium (TDMAT) as titanium precursor were delivered using bubbling methods with Ar carrier gas flow rate of 50 sccm into the reactor. Nitrogen plasma was used for plasma. In order to tune aluminum content as well as properties of aluminum doped titanium nitride, the following experiments were performed:

a. One super cycle consisting of one cycle of aluminum nitride (TDMAA/purge/plasma/purge=2s/20s/5*s/20s) and 10 cycles of titanium nitride (TDMAT/purge/plasma/purge=1s/10s/5*s/10s). The super cycle was repeated for 30 times.

b. One super cycle consisting of one cycle of aluminum nitride (TDMAA/purge/plasma/purge=2s/20s/5*s/20s) and 5 cycles of titanium nitride (TDMAT/purge/plasma/purge=1s/10s/5*s/10s). The super cycle was repeated for 50 times.

c. One super cycle consisting of two cycles of aluminum nitride (TDMAA/purge/plasma/purge=2s/20s/5*s/20s) and 5 cycles of titanium nitride (TDMAT/purge/plasma/purge=1s/10s/5*s/10s). The super cycle was repeated for 50 times.

TABLE 5

Composition using SIMS for aluminum doped titanium using tris(dimethylamino)aluminum (TDMAA) and tetrakis(dimethylamino)titanium (TDMAT), and nitrogen plasma

| Al | Ti | N | O | C | H | N/(Al + Ti) | Al/(Al +Ti) |
|---|---|---|---|---|---|---|---|
| 3.48 | 42.23 | 50.8 | 0.77 | 0.58 | 2.15 | 1.11 | 0.08 |
| 6.89 | 37.92 | 49.7 | 1.67 | 0.9 | 2.9 | 1.11 | 0.15 |
| 11 | 33.33 | 47.4 | 3.04 | 1.36 | 3.92 | 1.07 | 0.25 |

Figure 7:
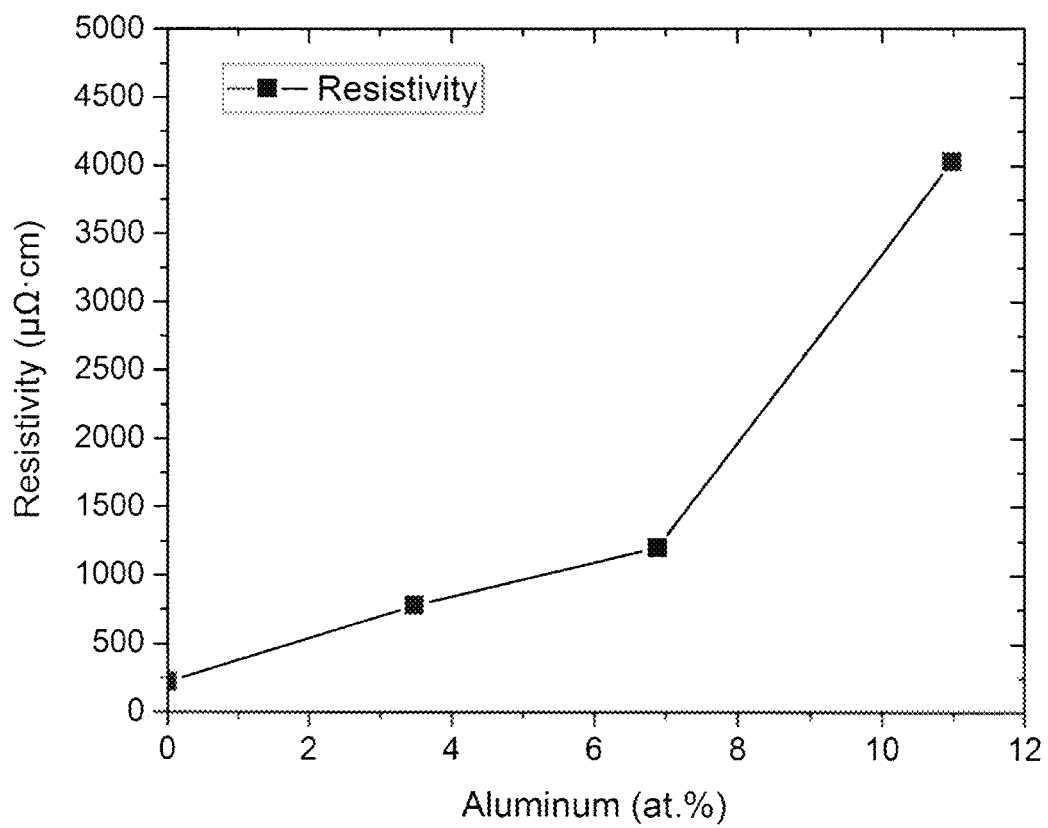
FIG. 7 shows resistivities of as-deposited aluminum doped titanium nitride, demonstrating resistivities of aluminum titanium nitride can be tuned via changing ALD conditions.

FIG. 7 shows the resistivities of as-deposited aluminum doped titanium nitride, demonstrating the resistivities can be tuned via changing ALD conditions.

Example 7

PEALD boron doped titanium nitride film using tris(dimethylamino)borane (TDMAB) and tetrakis(dimethylamino)titanium (TDMAT), and nitrogen plasma The silicon wafer was loaded into the CN-1 reactor equipped with showerhead design with 13.56 MHz direct plasma and heated to 300° C. with chamber pressure of 2 torr. Plasma power was at at 125 W. Tris(dimethylamino)borane (TDMAB) as boron precursor was delivered using vapor draw and tetrakis(dimethylamino)titanium (TDMAT) as titanium precursor was delivered using bubbling method with Ar carrier gas flow rate of 50 sccm into the reactor. Nitrogen plasma was used for plasma. In order to tune aluminum content as well as properties of aluminum doped titanium nitride, the following experiments were performed:

a. One super cycle consisting of one cycle of boron nitride (TDMAB/purge/plasma/purge=0.5s/10s/10*s/10s) and 5 cycles of titanium nitride (TDMAT/purge/plasma/purge=1s/10s/5*s/10s). The super cycle was repeated for 50 times.

b. One super cycle consisting of two cycles of boron nitride (TDMAB/purge/plasma/purge=0.5s/10s/10*s/10s) and 5 cycles of titanium nitride (TDMAT/purge/plasma/purge=1s/10s/5*s/10s). The super cycle was repeated for 50 times.

c. One super cycle consisting of three cycles of boron nitride (TDMAB/purge/plasma/purge=0.5s/10s/10*s/10s) and 5 cycles of titanium nitride (TDMAT/purge/plasma/purge=1s/10s/5*s/10s). The super cycle was repeated for 50 times.

d. One super cycle consisting of four cycles of boron nitride (TDMAB/purge/plasma/purge=0.5s/10s/10*s/10s) and 5 cycles of titanium nitride (TDMAT/purge/plasma/purge=1s/10s/5*s/10s). The super cycle was repeated for 50 times.

e. One super cycle consisting of five cycles of boron nitride (TDMAB/purge/plasma/purge=0.5s/10s/10*s/10s) and 5 cycles of titanium nitride (TDMAT/purge/plasma/purge=1s/10s/5*s/10s). The super cycle was repeated for 50 times.

TABLE 6

Composition using SIMS for boron doped titanium using tris(dimethylamino)borane (TDMAB) and tetrakis(dimethylamino)titanium (TDMAT), and nitrogen plasma

| B | Ti | N | O | C | H | N/(B + Ti) | B/(B + Ti) |
|---|---|---|---|---|---|---|---|
| 2.36 | 40.42 | 46.76 | 3.72 | 2.77 | 3.96 | 1.09 | 0 06 |
| 4.18 | 37.79 | 45.29 | 5.18 | 3.13 | 4.44 | 1.08 | 0.10 |
| 6.71 | 34.99 | 43.41 | 5.75 | 3.37 | 5.75 | 1.04 | 0.16 |
| 8.63 | 33.39 | 43.93 | 5.98 | 3.23 | 4.83 | 1.05 | 0.21 |
| 9.60 | 32.76 | 42.70 | 6.45 | 3.21 | 5.28 | 1.01 | 0.23 |

Figure 8:
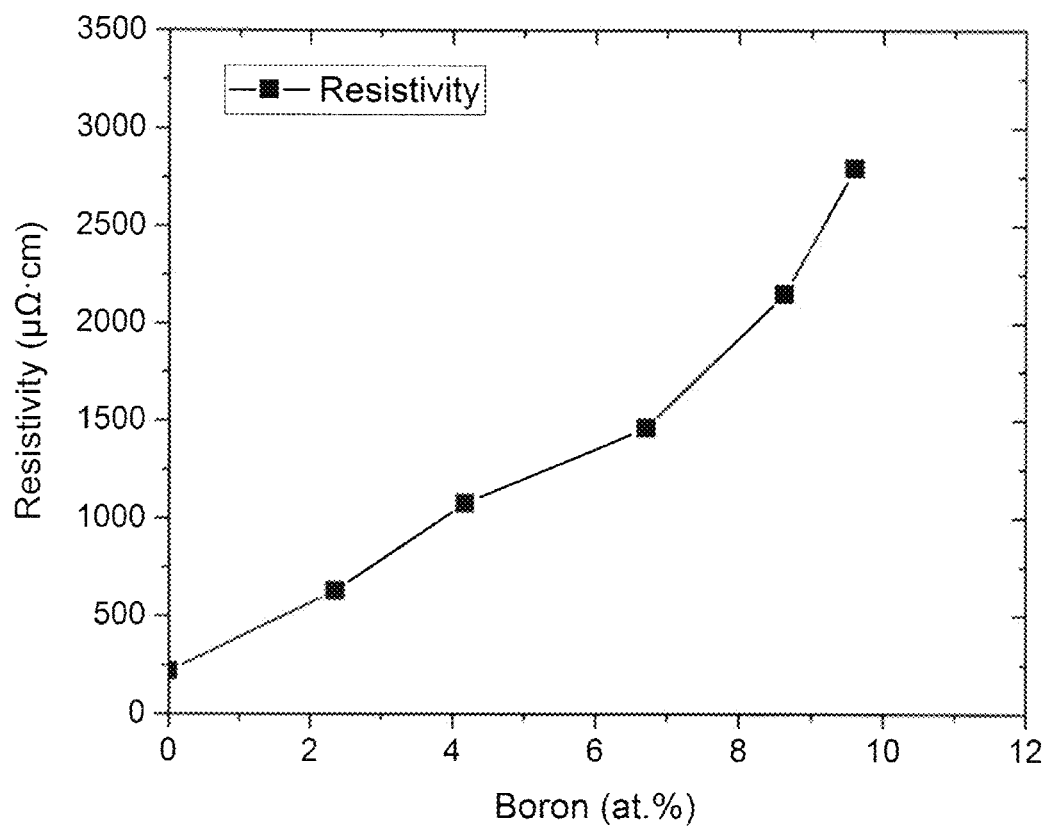
FIG. 8 shows the resistivities of as-deposited boron doped titanium nitride, demonstrating resistivities of boron titanium nitride can be tuned via changing ALD conditions.

FIG. 8 shows the resistivities of as-deposited boron doped titanium nitride, demonstrating the resistivities can be tuned via changing ALD conditions.

The invention claimed is:

1. A method of forming a high quality aluminum nitride film, via a plasma enhanced atomic layer deposition process (PEALD) or a PEALD-like process, the method comprising the steps of:

a. providing a substrate in a reactor;

b. heating the reactor to a temperature ranging from 100 to 400 degrees Celsius;

c. introducing into the reactor an at least one aluminum precursor represented by the following Formula 1:

$$MR_n(NR^1R^2)_{3-n}$$ 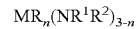

wherein M is aluminum (Al), R is selected from a linear or branched $C_1$ to $C_{10}$ alkyl group, a linear or branched $C_2$ to $C_{10}$ alkenyl group, a linear or branched $C_2$ to $C_{10}$ alkynyl group, a $C_1$ to $C_6$ dialkylamino group, an electron withdrawing group, and a $C_6$ to $C_{10}$ aryl group; $R^1$ is selected from hydrogen, a linear or branched $C_1$ to $C_{10}$ alkyl group, a linear or branched $C_3$ to $C_{10}$ alkenyl group, a linear or branched $C_3$ to $C_{10}$ alkynyl group, a $C_1$ to $C_6$ dialkylamino group, an electron withdrawing group, and a $C_6$ to $C_{10}$ aryl group; $R^2$ is selected from a linear or branched $C_1$ to $C_{10}$ alkyl group, a linear or branched $C_3$ to $C_6$ alkenyl group, a linear or branched $C_3$ to $C_6$ alkynyl group, a $C_1$ to $C_6$ dialkylamino group, a $C_6$ to $C_{10}$ aryl group, a linear or branched $C_1$ to $C_6$ fluorinated alkyl group, an electron withdrawing group, and a $C_4$ to $C_{10}$ aryl group; wherein n=0, 1, or 2 and wherein the at least one precursor reacts on at least a portion of the surface of the substrate to provide a chemisorbed layer;

d. purging the reactor with a purge gas;

e. introducing a non-hydrogen containing nitrogen plasma selected from the group consisting of nitrogen plasma, nitrogen/helium plasma and nitrogen/argon plasma into the reactor to react with at least a portion of the chemisorbed layer and provide at least one reactive site wherein the plasma is generated at a power density ranging from about 0.01 to about 1.5 W/cm$^2$; and a frequency range from 10 kilohertz to 60 megahertz;

f. optionally purging the reactor with an inert gas and g. repeating the steps b through f until a desired thickness of the high quality aluminum nitride film is obtained, wherein the high quality aluminum nitride film has a density of 2.4 grams per cubic centimeter or greater, a hydrogen concentration no greater than 16.14 atomic percent and a step coverage of 60 percent or greater.

2. The method of claim 1 wherein the at least one aluminum precursor is selected from the group consisting of tris(dimethylamino)aluminum, and tris(ethylmethylamino) aluminum.

3. The method of claim 1 wherein the method is accomplished via the plasma enhanced atomic layer deposition process.

4. The method of claim 1 wherein the method is accomplished via the PEALD-like process.

5. The method of claim 1 wherein the purge gas is a noble gas.

6. The method of claim 1, wherein the step e comprises applying energy to at least one of the precursor, nitrogen-containing source, reducing agent, other precursors or combinations thereof, wherein the energy is provided by at least one of the sources selected from the group consisting of thermal, plasma, pulsed plasma, helicon plasma, inductively coupled plasma, X-ray, e-beam, photon and remote plasma methods.

7. The method of claim 1 wherein $R^1$ and $R^2$ are the same.

8. The method of claim 1 wherein $R^1$ and $R^2$ are different.

9. The method of claim 1, wherein $R^1$ and $R^2$ are linked together to form a substituted or unsubstituted heterocyclic ring.

10. The method of claim 9, wherein the heterocyclic ring is selected from the group consisting of: pyrrolidino wherein $R^1$ and $R^2$ are linear $C_2$ alkyl groups; 2,5-dimethyl-pyrrolidino wherein $R^1$ and $R^2$ are branched $C_3$ alkyl groups; piperidino wherein $R^1$ and $R^2$ are linear $C_3$ alkyl groups; and 2,6-dimethylpiperidino wherein $R^1$ is a branched $C_3$ alkyl group and $R_2$ is a branched $C_4$ alkyl group.

11. The method of claim 1 further comprising the step of, prior to step e, introducing a plasma comprising hydrogen into the reactor to react with the at least a portion of the chemisorbed layer.

12. The method of claim 1 further comprising the step of treating the film once the desired thickness is achieved, wherein the treating is accomplished by exposure to an energy source selected from the group consisting of hydrogen plasma, helium plasma, argon plasma, UV radiation, IR radiation, and combinations thereof.

13. A method of forming a high quality aluminum nitride film, the method comprising the steps of:

a. providing a substrate in a reactor;

b. heating the reactor to a temperature from 100 to 400 degrees Celsius;

c. introducing into the reactor an at least one aluminum precursor selected from the group consisting of tris (dimethylamino)aluminum, and tris(ethylmethylamino)aluminum wherein the at least one aluminum precursor reacts on at least a portion of the surface of the substrate to provide a chemisorbed layer;

d. purging the reactor with a purge gas; and e. introducing a non-hydrogen containing nitrogen plasma selected from the group consisting of nitrogen plasma, nitrogen/helium plasma and nitrogen/argon plasma into the reactor to react with at least a portion of the chemisorbed layer and provide at least one reactive site wherein the plasma is generated at a power density ranging from about 0.01 to about 1.5 W/cm$^2$ and a frequency range from 10 kilohertz to 60 megahertz; and f. purging the reactor with an inert gas and g. repeating the steps b through f, until a desired thickness of the high quality aluminum nitride film is obtained, wherein the aluminum nitride film has a density of 2.4 grams per cubic centimeter or greater, a hydrogen concentration no greater than 16.14 atomic percent and a step coverage of 60 percent or greater.

14. The method of claim 13 wherein the method is accomplished via plasma enhanced atomic layer deposition process.

15. The method of claim 13 wherein the method is accomplished via the PEALD-like process.

16. The method of claim 13 wherein the non-hydrogen containing nitrogen plasma comprises $N_2$ plasma.

17. The method of claim 13 wherein the purge gas is a noble gas.

18. The method of claim 13, wherein the step e comprises applying energy to at least one of the precursor, nitrogen-containing source, reducing agent, other precursors or combinations thereof, wherein the energy is provided by at least one of the sources selected from the group consisting of thermal, plasma, pulsed plasma, helicon plasma, inductively coupled plasma, X-ray, e-beam, photon and remote plasma methods.

19. The method of claim 1, wherein the at least one aluminum precursor is tris(dimethylamino)aluminum.

* * * * *